US006713823B1

(12) United States Patent
Nickel

(10) Patent No.: US 6,713,823 B1
(45) Date of Patent: Mar. 30, 2004

(54) CONDUCTIVE ROUTINGS IN INTEGRATED CIRCUITS

(75) Inventor: Charles Nickel, San Jose, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

(21) Appl. No.: 10/094,775

(22) Filed: Mar. 8, 2002

(51) Int. Cl.[7] .............................................. H01L 27/092
(52) U.S. Cl. ........................ 257/401; 257/369; 257/758
(58) Field of Search ................................ 257/369, 401, 257/758

(56) References Cited

U.S. PATENT DOCUMENTS 4,636,825 A * 1/1987 Baynes ....................... 257/401
4,821,084 A * 4/1989 Kinugasa .................... 257/401
6,084,266 A * 7/2000 Jan ............................. 257/401
6,278,264 B1 * 8/2001 Burstein et al. ............ 257/700

* cited by examiner

Primary Examiner—Gene M. Munson
(74) Attorney, Agent, or Firm—Fish & Richardson P.C.

(57) ABSTRACT

An integrated circuit structure with a first layer that has a first conductive area and a second conductive area that is electrically isolated from the first area, and a second layer that has a third conductive area and a fourth conductive area that is electrically isolated from the third area. An edge of the first conductive area has an extended region that protrudes into the second conductive area. An edge of the fourth conductive area has an extended region that protrudes into the third conductive area. The first area is electrically coupled to the fourth area, and the second area is electrically coupled to the third area.

40 Claims, 4 Drawing Sheets

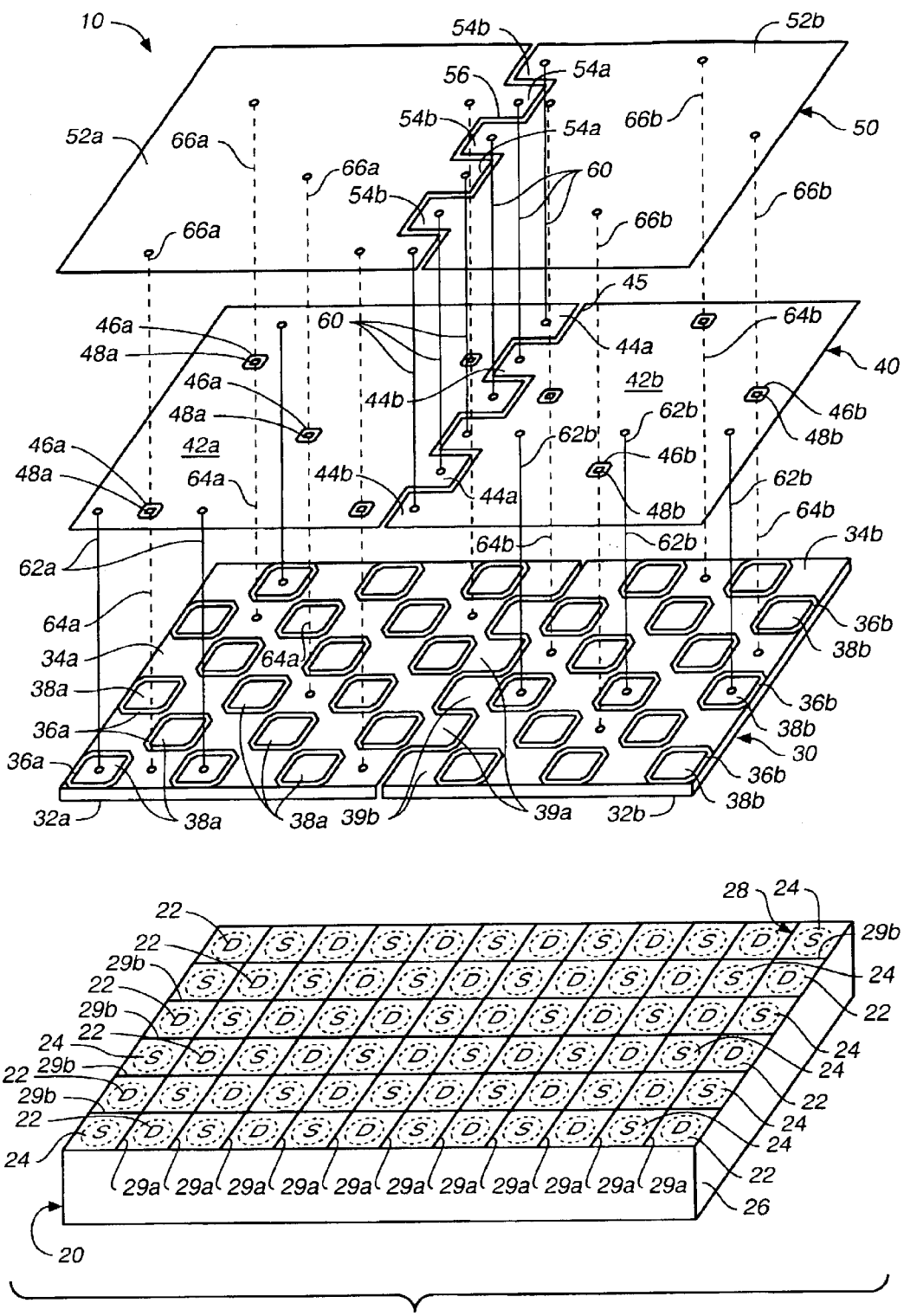
FIG._1

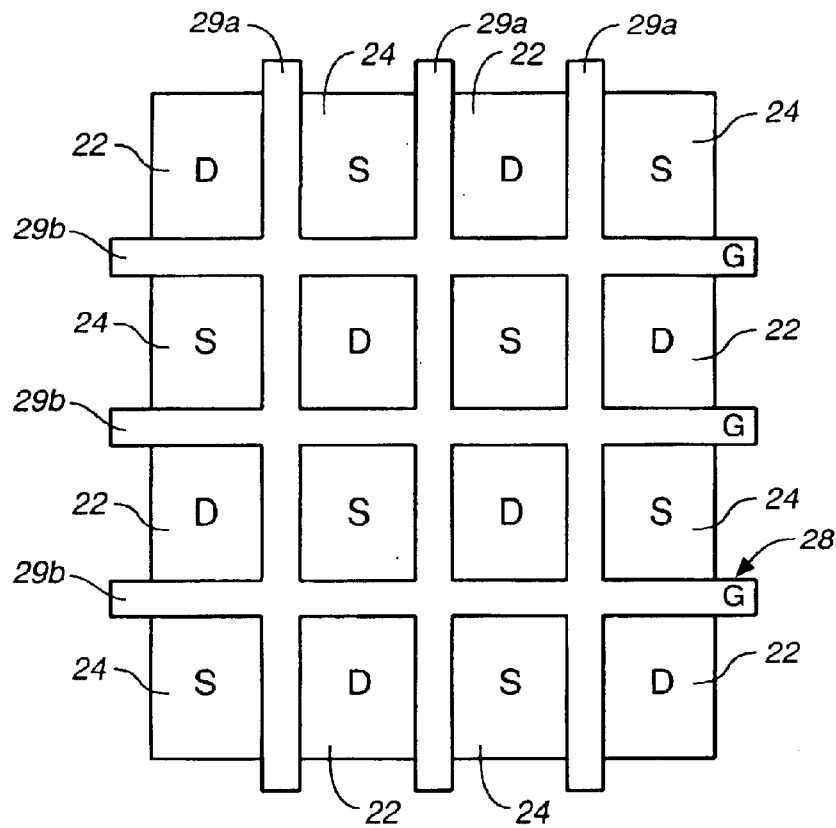
FIG._2
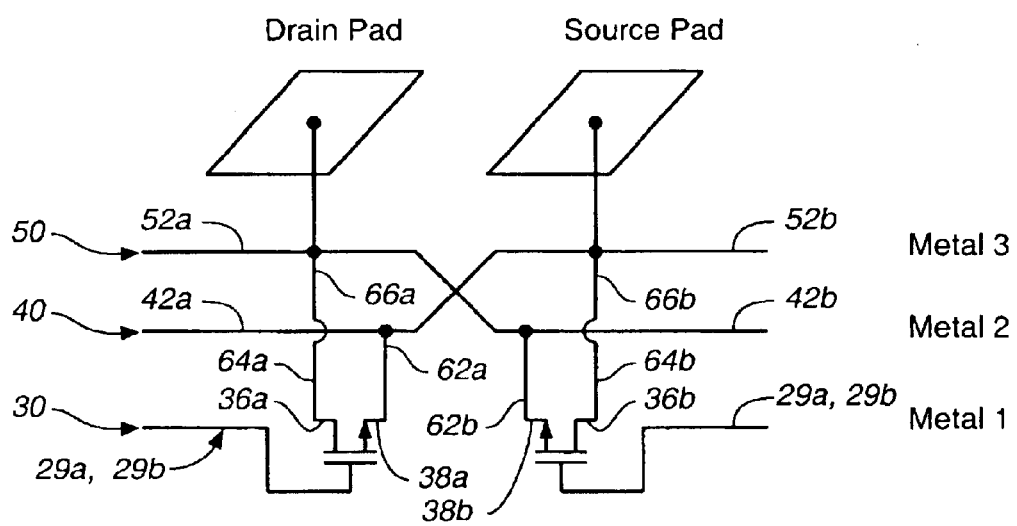
FIG._4

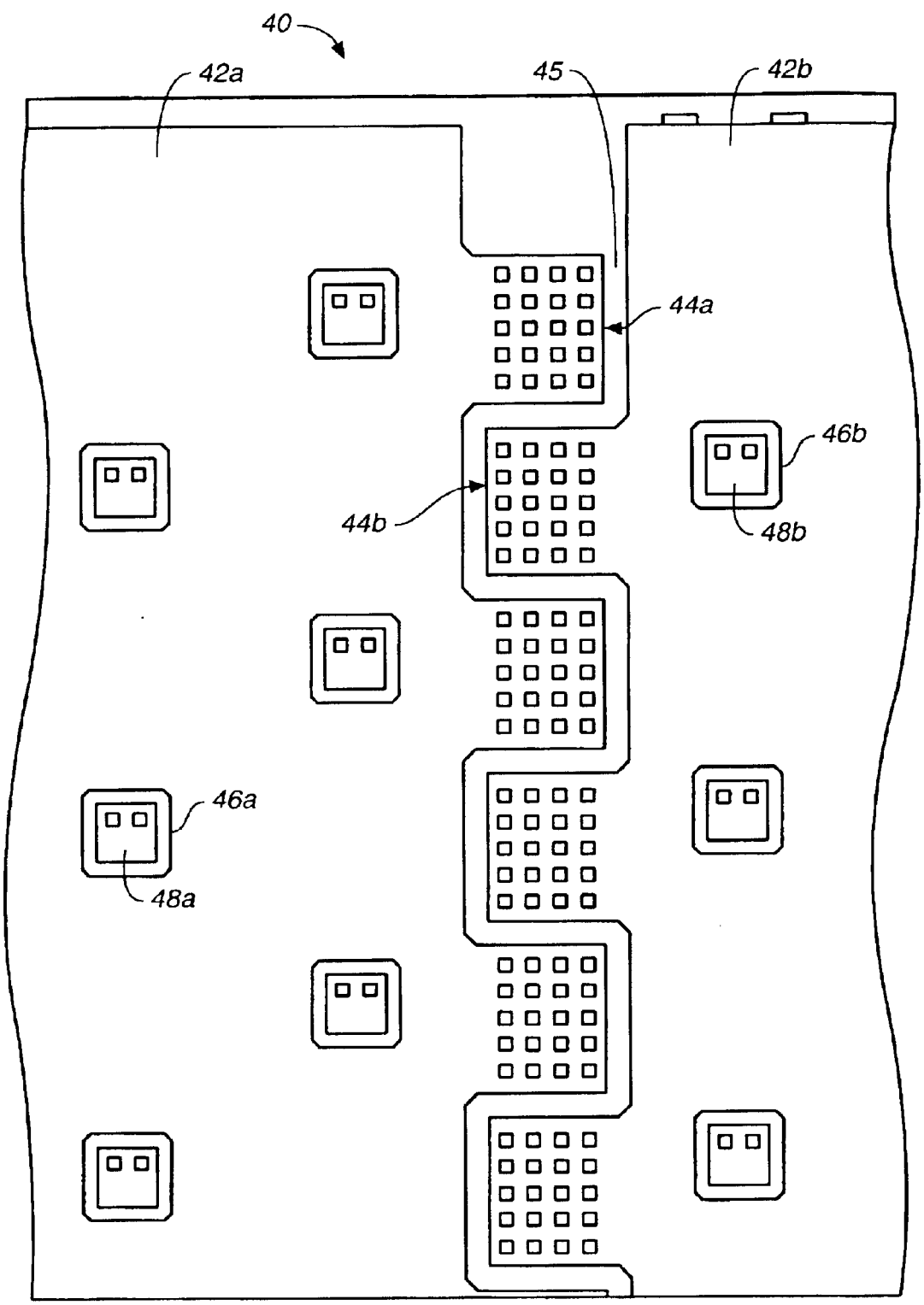
FIG._3

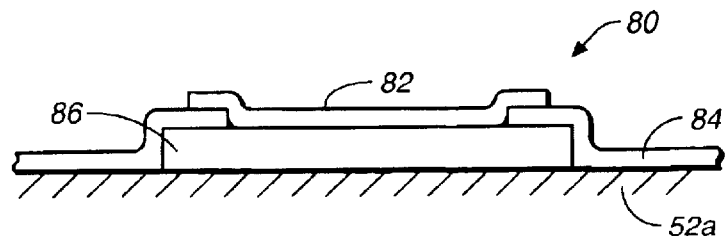
FIG._5
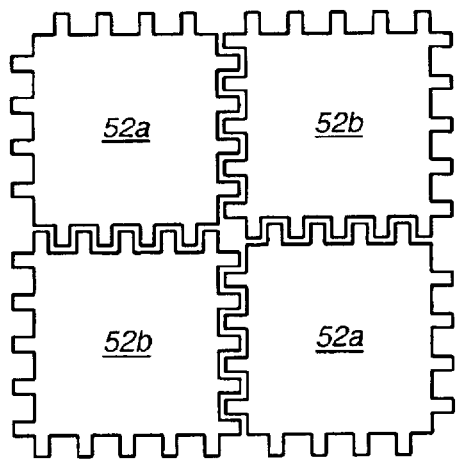
FIG._6
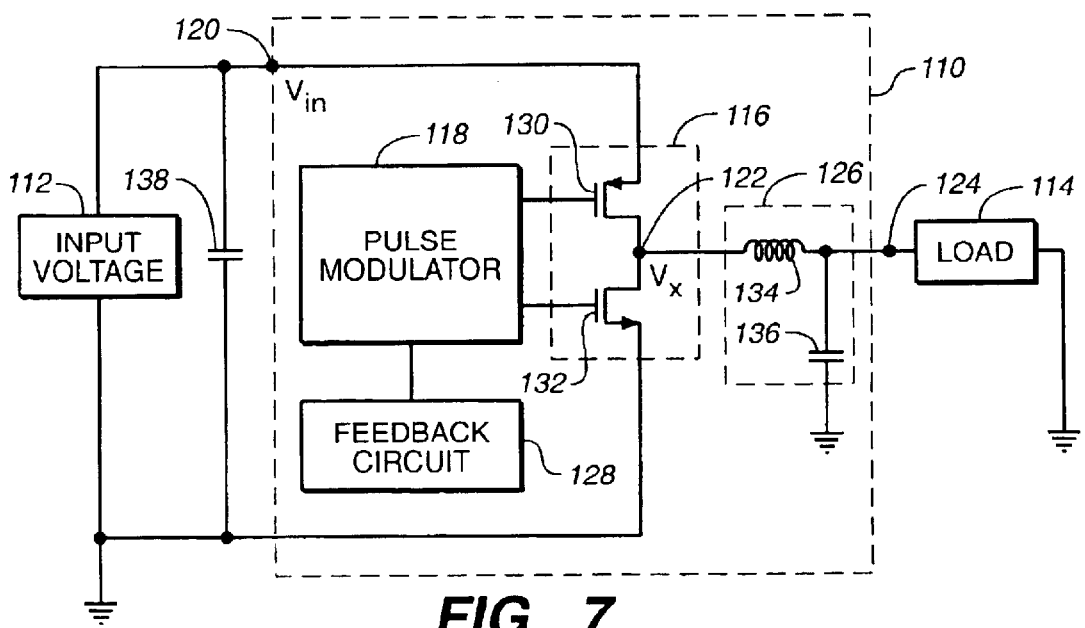
FIG._7

CONDUCTIVE ROUTINGS IN INTEGRATED CIRCUITS

BACKGROUND

The present invention relates generally to conductive routings in integrated circuits, and more particularly to conductive routings in integrated circuits that provide substantially continuous conductive planes for the flow of electrical currents.

Integrated circuits ("IC"), which generally refer to electronic circuits formed on a silicon or other semiconductor substrate, have widespread application in modem electronic systems. An IC chip may contain circuit devices, such as transistors, and electrical interconnects, such as lead lines to electrically couple the circuit devices. An IC chip may also contain conductive pads for providing electrical couplings of the chip to external devices, such as voltage sources and control circuits.

Traditionally, multiple conductive or metal layers in a chip provide conductive couplings between the terminals of transistors and conducting pads. Therefore, an IC chip having one or more transistors may have metal or conductive interconnects that electrically couple the source and drain regions of the transistors to the conducting pads of the IC chip. In the typical implementations of conducting pads for bond-wire-packaged chips, the conducting pads are arranged along the perimeter of the chips, and not above the functional area of transistors or other devices. More specifically, for an IC chip with vertical field effect transistors ("FETs"), source pads are arranged along the periphery of the top surface of a semiconductor substrate, and a drain connection is provided by a bulk semiconductor connection on backside. Therefore, in order to electrically couple doped regions in a substrate to conducting pads, metal lines are arranged to provide axial current flow through several metal layers and vias.

However, several concerns arise if the metal lines have an excessive length. First, increasing the length of the metal lines creates additional resistance for and power loss by the circuit. For modern applications of IC chips in portable devices, power loss as a result of increased resistance consumes additional electrical power and reduces the battery life of the portable devices. Second, the increased resistance and power loss also lead to heat dissipation problems that restrain the design and layout arrangement of the IC chip. The increased current density in conductive interconnects reduces the long-term reliability of a circuit. Third, providing additional area for conducting pads reduces the area available for functional devices, such as transistors, capacitors, resistors, and inductors. This inefficient layout increases the size and manufacturing cost of IC chips and associated packages.

In view of the foregoing, it would be advantageous to develop an IC structure with lower resistance, reduced power loss, and increased area for functional devices.

SUMMARY

In one aspect, the invention is directed to an integrated circuit structure with a first layer and a second layer. The first layer has a first conductive area and a second conductive area electrically isolated from the first conductive area. The first conductive area has an extended region at an edge of the first conductive area, and the extended region of the first conductive area protrudes into the second conductive area. The second layer is positioned over the first layer and has a third conductive area and a fourth conductive area electrically isolated from the third conductive area. The fourth conductive area has an extended region at an edge of the fourth conductive area that is electrically coupled to the extended region of the first conductive area.

In another aspect, the invention is directed to an integrated circuit structure with a substrate and a first layer over the substrate. The substrate has a first plurality of doped regions and a second plurality of doped regions. The first layer has a first conductive area that is a substantially continuous plane of a conductive material to provide a conductive coupling to the first plurality of doped regions covered by the first conductive area. The first conductive area has at least one isolated structure within the first conductive area to provide a conductive coupling between a second layer above the first conductive area and the second plurality of doped regions covered by the first conductive area.

Advantages of the invention may include the following. The lengths of conductive routings from doped regions in a substrate to conducting pads can be shortened. Interconnection resistance and power loss can be reduced. In addition, the conductive routing structure of the present invention can permit planar current flow so as to reduce resistance and current flow density, thereby increasing the reliability of circuits and devices. The area needed for providing conducting pads on an IC chip can be reduced. As a result, a chip implemented with the present invention can have cheaper dies in a smaller package, lower power loss, and shorter conductive path lengths than a traditional IC structure. The area available for functional devices in a chip, therefore, can be increased. At the same time, the performance of devices and circuits on a chip can be increased as a result of reduced resistance and power loss.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 1 is a schematic exploded perspective view of an integrated circuit structure in accordance with the invention.

FIG. 2 is a schematic plan view of the substrate from FIG. 1 with a distributed transistor fabricated in a checkerboard pattern.

FIG. 3 is a schematic plan view of the second conductive layer from the integrated circuit structure of FIG. 1.

FIG. 4 is a schematic circuit diagram of the integrated circuit structure of FIG. 1.

FIG. 5 is a schematic side view of a conducting pad the integrated circuit structure.

FIG. 6 is a schematic top view illustrating multiple adjacent conductive areas.

FIG. 7 is a block diagram of a switching regulator.

DETAILED DESCRIPTION

FIG. 1 illustrates one implementation of an integrated circuit structure 10 that can be used as a power switch. The structure 10 includes a substrate 20, a first conductive layer 30, a second conductive layer 40 over the first layer, and third conductive layer 50 over the second layer. The integrated circuit structure has an insulation layer between the first conductive layer 30 and the second conductive layer 40, and also between the second conductive layer 40 and the third conductive layer 50. The first conductive layer 30 can be formed directly on the substrate. The conductive layers can be formed of a metal, such as aluminum or copper, and the insulation layers can be formed of an oxide, such as silicon oxide.

The substrate 20 that lies under the first conductive layer 30 has a number of first doped regions 22 and a number of second doped regions 24 formed in a semiconductor substrate body 26. The first doped regions 22 and second doped regions 24 may be doped regions for a distributed transistor. If the switch is to be an PMOS transistor, then the doped regions 22 and 24 can be p-doped portions in an n-type substrate body 26. Alternatively, if the switch is to be an NMOS transistor, then the doped regions 22 and 24 can be n-doped portions in a p-type substrate body 26.

Referring to FIGS. 1 and 2, as illustrated, the first doped regions 22 serve as drain regions and the second doped regions 24 serve as source regions. Alternatively, the first doped regions 22 can serve as source regions and the second doped regions 24 can serve as drain regions. The drain regions and the source regions may be arranged in an alternating checkerboard pattern in the substrate 20 as shown in FIG. 1.

A gate 28 is also formed on the substrate 20. Assuming that the doped regions 22 and 24 are arranged in a checkerboard pattern, the gate can include a first set of parallel gate lines 29a and a second set of parallel gate lines 29b. The two sets of gate lines intersect to form a rectangular array that surrounds each doped region. The gate lines can be formed of a conductive material, such as polysilicon, that is separated from the semiconductor substrate body 26 by an insulator, such a silicon dioxide. An additional insulator layer may be formed over the polysilicon to prevent a short circuit with the first conductive layer 30. Since the gate lines extend off to the edges of the switching area, the vias for electrical connections to the gate lines can be made near the edge of the switch, away from the interconnects for the source and drain.

Returning to FIG. 1, the first conductive layer 30 includes a first region 32a and a second region 32b. The first region 32a includes a generally continuous interconnected conductive sheet 34a with periodically spaced apertures 36a. A conductive island 38a is formed in each aperture 36a. Similarly, the second region 32b includes a conductive sheet 34b with periodically spaced apertures 36b and conductive islands 38b formed in the aperture 36b.

In the first region 32a, the conductive islands 38a overlie the source regions 24, whereas the conductive sheet 34a overlies and interconnects the drain regions 22. In contrast, in the second region 32b, the conductive islands 38b overlie the drain regions 22 and the conductive sheet 34b overlies and interconnects the source regions 24. Thus, the combination of the conductive sheet 34a and the conductive islands 38b form a drain electrode, whereas the combination of the conductive sheet 34b and the conductive islands 38a form a source electrode. The adjacent portions of the conductive sheets 34a and 34b can form interleaved projections 39a and 39b that overlie the drain and source regions 22 and 24, respectively. Although the electrode patterns in the first and second regions 32a and 32b are illustrated as identical, they need not be.

Referring to FIGS. 1 and 3, the second layer 40 includes a first conductive area 42a and a second conductive area 42b that are electrically isolated. The first conductive area 42a has an extended region 44a that protrudes from the right side of the first conductive area 42a toward the second conductive area 42b. Similarly, the second conductive area 42b can have an extended region 44b that protrudes from the left side of the second conductive area 42b toward the first conductive area 42a. An insulation layer 45 between the two extended regions electrically isolates the first conductive area 42a from the second conductive area 42b.

The extended region 44a at the edge of the first conductive area 42a may be one or more lateral protrusions, such as a plurality of rectangular protrusions. Similarly, the extended region 44b of the second conductive area 42b may be a plurality of rectangular protrusions. The rectangular protrusions of the two conductive areas can interlace in an alternating pattern to form a region of inter-digited protrusions at the common edge of the conductive areas 42a and 42b.

As discussed further below, the lateral protrusions 44a of the first conductive area 42a may vertically underlie protrusions 54b from a fourth conductive area 52b in the third conductive layer 50. Similarly, the lateral protrusions 44b of the second conductive area 42b may vertically underlie protrusions 54a from a third conductive area 52a in the third conductive layer 50. Electrical couplings between the first conductive area 42a and the fourth conductive area 52b can be formed by vertical vias 60. Electrical couplings between the second conductive area 42b and the third conductive area 52a can also be formed by vertical vias 60.

The conductive areas of the second conductive layer 40 are connected by vias 62 to the conductive islands in the first conductive layer 30. Specifically, in the first region 32a, the second doped regions 24 and their associated conductive islands 38a are electrically coupled to the first conductive area 42a of the second metal layer 40 through a number of vertical vias 62a. Similarly, in the second region 32b, the first doped regions 22 and their associated conductive islands 38b are electrically coupled to the second conductive area 42b of the second metal layer 40 through a number of vertical vias 62b. For the purpose of clarity, not every via is illustrated.

The first conductive area 42a can be a substantially continuous plane of a conductive material, such as a metal layer. However, to provide access to the first doped regions 22 from an overlying third conductive area 52a, the first conductive area 42a may have one or more isolation structures. Similarly, the second conductive area 42b can be a substantially continuous plane of a conductive material, such as a metal layer with one or more isolation structures to provide access to the second doped regions 24 from an overlying fourth conductive area 52b. These isolation structures will be further discussed below.

Returning to FIG. 1, the third conductive layer 50 is similar to the second conductive layer 40, and includes a third conductive area 52a and a fourth conductive area 52b that are electrically isolated. The third conductive area 52a has an extended region 54a that protrudes from the right side of the third conductive area 52a toward the fourth conductive area 52b. Similarly, the fourth conductive area 52b can have an extended region 54b that protrudes from the left side of the fourth conductive area 52b toward the third conductive area 52a. An insulation layer 56 between the two extended regions electrically isolates the third conductive area 52a from the fourth conductive area 52b.

The third conductive area 52a may substantially overlap the first conductive area 42a except for the extended regions. Similarly, the fourth conductive area 52b may substantially overlap the second conductive area 42b except for the extended regions.

The extended region 54a at the edge of the third conductive area 52a may be one or more lateral protrusions, such as a plurality of rectangular protrusions. Similarly, the extended region 54b of the fourth conductive area 52b may be a plurality of rectangular protrusions. The rectangular protrusions of the two conductive areas can interlace in an alternating pattern to form a region of inter-digited protrusions at the common edge of the conductive areas 52a and 52b.

The lateral protrusions 54b of the fourth conductive area 52b overlap the lateral protrusions 44a of the first conductive area 42a, and vertical vias 60 provide electrical couplings between the overlapped areas. Similarly, the lateral protrusions 54a of the third conductive area 52a overlap the lateral protrusions 44b of the second conductive area 42b, and vertical vias 60 provide electrical couplings between the overlapped areas. The overlapping protrusions and vertical vias form an "interstitching" structure that electrically couples the third conductive area 52a with the second conductive area 42b, and electrically couples the fourth conductive area 52b with the first conductive area 42a.

Returning to the isolation structures mentioned above, the first conductive area 42a and the second conductive area 42b each include a number of "windows" 46a and 46b, respectively. Each window 46a and 46b includes a conductive insert 48a and 48b, respectively. Vertical vias 64a connect the conductive sheet 34a in the first region 32a to the inserts 48a in the first conductive area 42a, and further vias 66a connect these inserts 48a to the third conductive layer 50. Similarly, vertical vias 64b connect the conductive sheet 34b in the second region 32b to the inserts 48b in the second conductive area 42b, and further vias 66b connect these inserts 48b to the third conductive layer 50. Thus, the windows 46a and 46b permit vias to electrically couple the first metal layer 50 to the conductive sheets 34a and 34b, while electrically isolating the conductive sheets 34a and 34b from the conductive areas 42a and 42b, respectively. (Illustrated by dashed lines.)

By coupling electrically the first and fourth conductive areas 42a and 52b, all the second doped regions 24 become coupled to the fourth conductive area 52b. Similarly, by coupling electrically the second and third conductive areas 42b and 52a, all the first doped regions 22 become are coupled to the third conductive area 52a. Thus, the third conductive area 52a becomes the drain electrode, and the fourth conductive area 52b becomes the source electrode.

In summary, FIG. 1 illustrates an implementation in which the source regions 24 are electrically coupled to the first and fourth conductive areas 42a and 52b, the drain regions 22 are electrically coupled to the second and third conductive areas 42b and 52a, and first and second metal layers are connected by an interstitching that keeps the drain and source electrodes electrically isolated. A schematic circuit diagram of this configuration is illustrated in FIG. 4.

Although FIG. 1 illustrates an example where the islands 38a and 38b are coupled to the second conductive layer 40 and the continuous metal sheets 34a and 34b are coupled to the first conductive layer 30 through the isolation structures, the reverse is possible. In addition, many other layouts of the doped regions and the first conductive layer 30 are possible. For example, the doped regions and first conductive layer 30 could be alternating stripes instead of a checkerboard pattern. In this case, the interstitching of the second conductive layer 40 and third conductive layers 50 can still be advantageous.

The third conductive area 52a and the fourth conductive area 52b may have one or more conducting pads to provide an external electrical coupling to external elements. FIG. 5 illustrates a conducting pad 80 on the third conductive area 52a. The conducting pad 80 can include a final metal layer 82, such as aluminum, a nitride passivation layer 84, and an under-bump metalization ("UBM") layer 86. Similarly, the fourth conductive area 52b can have one or more conducting pads to provide an external electrical coupling to external elements.

Although FIG. 1 illustrates just two adjacent conductive areas, the integrated circuit structure can be fabricated with multiple interconnected areas. For example, referring to FIG. 6, the conductive areas 52a and 52b can be formed in a checkerboard pattern, with interstitching connecting the second and third conductive layers at the adjacent boarder of each pair of conductive areas. Alternatively, the conductive areas 52a and 52b can be in arranged in alternating rows, columns, or in some other pattern. This permits the source and drain pads on the top surface of a chip to be arranged in rows, columns, in a checkerboard, or in some other pattern.

With the aforementioned implementation, the integrated circuit structure of the present invention couples the electrical islands to the conductive planes of the second conductive layer with short vertical interconnects. The continuous metal sheets of the first conductive layer are connected to the conductive planes of the third conductive layer with longer vertical interconnects. However, the large conductive planes of the second and third conductive layers are coupled at the interstitching. The planar current flow in the conductive planes and the short path of direct vertical interconnects reduce the current flow density and resistance of interconnects. The invention therefore reduces power loss of circuits and improves the reliability of circuits and devices. If conducting pads can be placed above the functional area, the invention reduces area needed for providing conducting pads on an IC chip and produces cheaper dies in a smaller package than a traditional IC structure.

The present invention may be implemented to various kinds of IC chips for providing external couplings to the IC chips. Without limiting the scope of the present invention, the implementation of the invention to an IC chip for voltage regulators is illustrated in detail below as an example.

Voltage regulators, such as DC-to-DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be an efficient type of DC-to-DC converter. A switching regulator generates an output voltage by converting an input DC voltage into a high frequency voltage, and filtering the high frequency voltage to generate the output DC voltage. Specifically, the switching regulator includes a switch for alternately coupling and decoupling an input DC voltage source, such as a battery, to a load, such as an IC chip. An output filter, typically including an inductor and a capacitor that are provided between the input voltage source and the load, filters the output of the switch and thus provides the output DC voltage. A pulse modulator, such as a pulse width modulator or a pulse frequency modulator, typically controls the switch.

Referring to FIG. 7, an implementation of a switching regulator 110 is coupled to a DC input voltage source 112, such as a battery, by an input terminal 120. The switching regulator 110 is also coupled to a load 114, such as an IC chip, by an output terminal 124. The switching regulator 110 serves as a DC-to-DC converter between the input terminal 120 and the output terminal 124. The switching regulator 110 includes a switching circuit 116 that serves as a power switch for alternately coupling and decoupling the input terminal 120 to an intermediate terminal 122. The switching circuit 116 includes a rectifier, such as a switch or diode, coupling the intermediate terminal 122 to ground. Specifically, the switching circuit 116 and the output filter 126 may be configured in a buck converter topology with a first transistor 130 having a source connected to the input terminal 120 and a drain connected to the intermediate terminal 122 and a second transistor 132 having a source connected to ground and a drain connected to the intermediate terminal 122. The first transistor 130 may be a P-type MOS (PMOS) device, whereas the second transistor 132 may be an N-type MOS (NMOS) device. The switching regulator 110 may also include an input capacitor 38 connecting the input terminal 122 to ground.

The switching regulator also includes a controller assembly with a pulse modulator 118 for controlling the operation of the switching circuit 116. The pulse modulator 118 causes the switching circuit 116 to generate an intermediate voltage having a rectangular waveform at the intermediate terminal 122. Although the pulse modulator 118 and the switching circuit 116 are illustrated and described below as a pulse width modulator, the invention is also applicable to various pulse frequency modulation schemes.

The intermediate terminal 122 is coupled to the output terminal 124 by an output filter 126. The output filter 126 converts the rectangular waveform of the intermediate voltage at the intermediate terminal 122 into a substantially DC output voltage at the output terminal 124. Specifically, in a buck-converter topology, the output filter 126 includes an inductor 134 connected between the intermediate terminal 122 and the output terminal 124 and a capacitor 136 connected in parallel with the load 114. During a PMOS conduction period, the voltage source 112 supplies energy to the load 114 and the inductor 134 via the first transistor 130. On the other hand, during an NMOS conduction period, the inductor 134 supplies the energy. The resulting output voltage $V_{out}$ is a substantially DC voltage. Although the switching circuit 116 and the output filter 126 are illustrated in a buck converter topology, the invention is also applicable to other switching voltage regulator topologies, such as a boost converter or a buck-boost converter topology.

The output voltage is regulated, or maintained at a substantially constant level, by a feedback loop in the controller assembly that includes a feedback circuit 128. The feedback circuit 128 includes circuitry that measures the output voltage and/or the current passing through the output terminal. The measured voltage and current are used to control the pulse modulator 118 so that the output voltage at the output terminal 124 remains substantially constant.

The conductive routings of the present invention can be used in the switching circuit 116 to provide a flip-chip package that includes the switching circuit and provides external couplings. In general, each switch in the switching circuit 116 is fabricated as a distributed array of parallel transistors, and the conductive routing structures discussed above can carry current from the doped regions to the conducting pads on the surface of the chip.

For example, the NMOS transistor 132 can include rectangular n-doped source regions 24 and drain regions 22 laid out in a checkerboard pattern in a p-type well or substrate. The PMOS transistor array 130 will be constructed similarly, with alternating rectangular p-doped source regions and drain regions in an n-type well or substrate. A grid-like gate 28 separates each pair of source and drain regions. Electrical connection to the gate can be provided at the edge of the chip.

With the aforementioned implementation, the integrated circuit structure of the present invention couples the drain and source regions of one or more transistor arrays in voltage regulators to conductive planes with direct vertical interconnects. The integrated circuit structure provides conducting pads on the top surface of the conductive planes, such as the third conductive area 52a and the fourth conductive area 52b, above the functional area of transistors. The planar current flow in the conductive planes and the short path of vertical interconnects reduce the resistance and power loss of voltage regulators and improves the reliability of circuits and devices. The invention also saves area needed for providing conducting pads on an IC chip and produces cheaper dies of voltage regulators in a smaller package than a traditional IC structure.

A number of embodiments of the invention have been described. Nevertheless, it will be understood that various modifications may be made without departing from the spirit and scope of the invention. Numerous modifications to the configuration of the conductive routings structure will occur to those of ordinary skill in the art. Accordingly, other embodiments are within the scope of the following claims.

What is claimed is:

1. An integrated circuit structure comprising:
   a first layer having a first conductive area and a second conductive area electrically isolated from the first conductive area, the first conductive area having an extended region at an edge of the first conductive area, the extended region of the first conductive area protruding into the second conductive area; and
   a second layer over the first layer, the second layer having a third conductive area and a fourth conductive area electrically isolated from the third conductive area, the fourth conductive area having an extended region at an edge of the fourth conductive area that is electrically coupled to the extended region of the first conductive area.

2. The integrated circuit structure of claim 1, wherein the fourth conductive area overlaps the first conductive area only in the extended region of the fourth conductive area and the extended region of the first conductive area.

3. The integrated circuit structure of claim 1, wherein the fourth conductive area has a pad for providing an external conductive coupling.

4. The integrated circuit structure of claim 1, wherein the integrated circuit structure further comprises a substrate under the first layer, the substrate having a first plurality of doped regions, and the fourth conductive area and the first conductive area being electrically coupled to the first plurality of doped regions.

5. The integrated circuit structure of claim 4, wherein the integrated circuit structure has a plurality of transistors and the first plurality of doped regions are source regions of the transistors.

6. The integrated circuit structure of claim 4, wherein the integrated circuit structure has a plurality of transistors and the first plurality of doped regions are drain regions of the transistors.

7. The integrated circuit structure of claim 1, wherein the third conductive area substantially overlaps the first conductive area, and the fourth conductive area substantially overlaps the second conductive area.

8. The integrated circuit structure of claim 1, wherein the extended region of the fourth conductive area has at least one lateral protrusion, the extended region of the first conductive area having at least one lateral protrusion that is electrically coupled to the lateral protrusion of the fourth conductive area, the lateral protrusion of the fourth conductive area overlapping the lateral protrusion of the first conductive area.

9. The integrated circuit structure of claim 1, wherein the first conductive area is a substantially continuous plane of a conductive material, and the first conductive area has at least one isolated structure within the first conductive area for providing a conductive coupling between a plurality of underlying doped regions and the third conductive area that overlies the first conductive area.

10. The integrated circuit structure of claim 1, wherein the extended region of the fourth conductive area is electrically coupled to the extended region of the first conductive area through vertical via.

11. The integrated circuit structure of claim 1, wherein the third conductive area has an extended region at an edge of the third conductive area that is electrically coupled to an extended region at an edge of the second conductive area.

12. The integrated circuit structure of claim 11, wherein the third conductive area overlaps the second conductive area only in the extended region of the third conductive area and the extended region of the second conductive area.

13. The integrated circuit structure of claim 11, wherein the third conductive area has a pad for providing an external conductive coupling.

14. The integrated circuit structure of claim 11, wherein the extended region of the first conductive area neighbors the extended region of the second conductive area with an insulation layer in-between.

15. The integrated circuit structure of claim 11, wherein the integrated circuit structure further comprises a substrate having a first plurality of doped regions and a second plurality of doped regions, and the third conductive area and the second conductive area are electrically coupled to the second plurality of doped regions.

16. The integrated circuit structure of claim 15, wherein the first plurality of doped regions and the second plurality of doped regions are arranged in an alternating pattern in the substrate.

17. The integrated circuit structure of claim 15, wherein the integrated circuit structure has a plurality of transistors and the second plurality of doped regions are source regions of the transistors.

18. The integrated circuit structure of claim 15, wherein the integrated circuit structure has a plurality of transistors and the second plurality of doped regions are drain regions of the transistors.

19. The integrated circuit structure of claim 11, wherein the extended region of the third conductive area has at least one lateral protrusion, the extended region of the second conductive area having at least one lateral protrusion that is electrically coupled to the lateral protrusion of the third conductive area, the lateral protrusion of the third conductive area overlapping the lateral protrusion of the second conductive area.

20. The integrated circuit structure of claim 11, wherein the extended region of the third conductive area is electrically coupled to the extended region of the second conductive area through vertical via.

21. The integrated circuit structure of claim 11, wherein the second conductive area is a substantially continuous plane of a conductive material, and the second conductive area has at least one isolated vertical structure within the second conductive area for providing a conductive coupling between a plurality of underlying doped regions and the fourth conductive area that overlies the second conductive area.

22. The integrated circuit structure of claim 1, wherein the integrated circuit structure further comprises an underlying conductive layer under the first layer and above the substrate, the underlying conductive layer providing conductive couplings from first underlying doped regions and second underlying doped regions in a substrate respectively to the first conductive area and the third conductive area.

23. An integrated circuit structure comprising:
 a substrate having a first plurality of doped regions and a second plurality of doped regions; and
 a first layer over the substrate, the first layer having a first conductive area, the first conductive area being a substantially continuous plane of a conductive material providing a conductive coupling to the first plurality of doped regions covered by the first conductive area, the first conductive area having at least one isolated structure within the first conductive area for providing a conductive coupling between a second layer above the first conductive area and the second plurality of doped regions covered by the first conductive area.

24. The integrated circuit structure of claim 23, wherein the first layer has a second conductive area electrically isolated from the first conductive area, the second conductive area being a substantially continuous plane of a conductive material providing a conductive coupling to the second plurality of doped regions covered by the second conductive area.

25. The integrated circuit structure of claim 24, wherein the second conductive area has at least one isolated structure within the second conductive area for providing a conductive coupling between a second layer above the second conductive area and the first plurality of doped regions covered by the second conductive area.

26. The integrated circuit structure of claim 23, wherein second layer that lies over the first layer has a third conductive area and a fourth conductive area electrically isolated from the third conductive area, the first conductive area having an extended region at an edge of the first conductive area, the fourth conductive area having an extended region at an edge of the fourth conductive area that is electrically coupled to the extended region of the first conductive area, the fourth conductive area and the first conductive area being electrically coupled to the first plurality of doped regions.

27. The integrated circuit structure of claim 26, wherein the fourth conductive area overlaps the first conductive area only in the extended region of the fourth conductive area and the extended region of the first conductive area.

28. The integrated circuit structure of claim 26, wherein the fourth conductive area has a pad for providing an external conductive coupling.

29. The integrated circuit structure of claim 26, wherein the extended region of the fourth conductive area has at least one lateral protrusion, the extended region of the first conductive area having at least one lateral protrusion that is electrically coupled to the lateral protrusion of the fourth conductive area, the lateral protrusion of the fourth conductive area overlapping the lateral protrusion of the first conductive area.

30. The integrated circuit structure of claim 26, wherein the extended region of the fourth conductive area is electrically coupled to the extended region of the first conductive area through vertical via.

31. The integrated circuit structure of claim 26, wherein the third conductive area substantially overlaps the first conductive area, and the fourth conductive area substantially overlaps the second conductive area.

32. The integrated circuit structure of claim 26, wherein the second conductive area has an extended region at an edge of the second conductive area, the third conductive area having an extended region at an edge of the third conductive area that is electrically coupled to the extended region of the second conductive area, the third conductive area and the second conductive area being electrically coupled to the second plurality of doped regions.

33. The integrated circuit structure of claim 32, wherein the third conductive area overlaps the second conductive area only in the extended region of the third conductive area and the extended region of the second conductive area.

34. The integrated circuit structure of claim 32, wherein the extended region of the third conductive area has at least one lateral protrusion, the extended region of the second conductive area having at least one lateral protrusion that is electrically coupled to the lateral protrusion of the third conductive area, the lateral protrusion of the third conductive area overlapping the lateral protrusion of the second conductive area.

35. The integrated circuit structure of claim 32, wherein the extended region of the third conductive area is electrically coupled to the extended region of the second conductive area through vertical via.

36. The integrated circuit structure of claim 32, wherein the extended region of the second conductive area neighbors an edge of the first conductive area with an insulation layer in-between.

37. The integrated circuit structure of claim 32, wherein the first plurality of doped regions and the second plurality of doped regions in the substrate are arranged in an alternating pattern.

38. The integrated circuit structure of claim 32, wherein the third conductive area has a pad for providing an external conductive coupling.

39. The integrated circuit structure of claim 32, wherein the integrated circuit structure has a plurality of transistors, the first plurality of doped regions being source regions of the transistors, the second plurality of doped regions being drain regions of the transistors.

40. The integrated circuit structure of claim 32, wherein the integrated circuit structure has a plurality of transistors, the first plurality of doped regions being drain regions of the transistors, the second plurality of doped regions being source regions of the transistors.

* * * * *

(12) EX PARTE REEXAMINATION CERTIFICATE (7822nd)

United States Patent
Nickel

(10) Number: US 6,713,823 C1
(45) Certificate Issued: Oct. 19, 2010

(54) CONDUCTIVE ROUTINGS IN INTEGRATED CIRCUITS

(75) Inventor: Charles Nickel, San Jose, CA (US)

(73) Assignee: Volterra Semiconductor Corporation, Fremont, CA (US)

Reexamination Request:
No. 90/009,436, Mar. 25, 2009

Reexamination Certificate for:
Patent No.: 6,713,823
Issued: Mar. 30, 2004
Appl. No.: 10/094,775
Filed: Mar. 8, 2002

(51) Int. Cl.
*H01L 23/482* (2006.01)
*H01L 23/528* (2006.01)
*H01L 27/088* (2006.01)
*H01L 23/48* (2006.01)
*H01L 27/085* (2006.01)
*H01L 23/52* (2006.01)

(52) U.S. Cl. .................. 257/401; 257/369; 257/758; 257/E23.151; 257/E23.015; 257/E27.06

(58) Field of Classification Search .................. None
See application file for complete search history.

(56) References Cited

U.S. PATENT DOCUMENTS

| | | |
|---|---|---|
| 560,257 A | 5/1896 | Leas et al. |
| 3,689,991 A | 9/1972 | Aird |
| 3,739,236 A | 6/1973 | Loro |
| 3,922,712 A | 11/1975 | Stryker |
| 4,000,842 A | 1/1977 | Burns |
| 4,074,342 A | 2/1978 | Honn et al. |
| 4,095,165 A | 6/1978 | Boros |
| 4,109,194 A | 8/1978 | Miller |
| 4,188,438 A | 2/1980 | Burns |
| 4,233,558 A | 11/1980 | Gaertner |
| 4,255,672 A | 3/1981 | Ohno et al. |
| 4,292,581 A | 9/1981 | Tan |
| 4,309,650 A | 1/1982 | Boros et al. |
| 4,315,316 A | 2/1982 | Boros et al. |
| 4,353,114 A | 10/1982 | Saleh |
| 4,356,542 A | 10/1982 | Bruckner et al. |
| 4,357,572 A | 11/1982 | Andersen et al. |
| 4,520,298 A | 5/1985 | Abbondanti |
| 4,521,725 A | 6/1985 | Phaneuf |
| 4,580,089 A | 4/1986 | Grunsch et al. |
| 4,612,617 A | 9/1986 | Laplace, Jr. et al. |
| 4,630,187 A | 12/1986 | Henze |
| 4,636,825 A | 1/1987 | Baynes |
| 4,695,865 A | 9/1987 | Wagenaar |
| 4,725,940 A | 2/1988 | Henze |
| 4,761,725 A | 8/1988 | Henze |
| 4,805,079 A | 2/1989 | Van Buul |
| 4,821,084 A | 4/1989 | Kinugasa et al. |

(Continued)

FOREIGN PATENT DOCUMENTS

| | | |
|---|---|---|
| EP | 0 357 064 | 3/1993 |
| EP | 0 547916 | 6/1993 |
| WO | WO85/04518 | 10/1985 |
| WO | WO95/31033 | 11/1995 |
| WO | WO99/31790 | 6/1999 |
| WO | WO01/57608 | 8/2001 |

OTHER PUBLICATIONS

Schofield, Hazel, et al., "FlipFET™ MOSFET Design for High Volume SMT Assembly," Mar. 19, 2001, International Rectifier. 6 pgs.

(Continued)

*Primary Examiner*—Erik Kielin

(57) ABSTRACT

An integrated circuit structure with a first layer that has a first conductive area and a second conductive area that is electrically isolated from the first area, and a second layer that has a third conductive area and a fourth conductive area that is electrically isolated from the third area. An edge of the first conductive area has an extended region that protrudes into the second conductive area. An edge of the fourth conductive area has an extended region that protrudes into the third conductive area. The first area is electrically coupled to the fourth area, and the second area is electrically coupled to the third area.

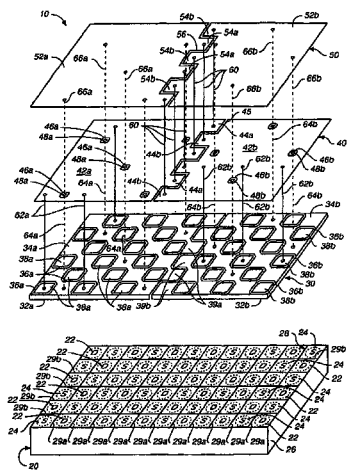

U.S. PATENT DOCUMENTS

| | | |
|---|---|---|
| 4,833,513 A | 5/1989 | Sasaki |
| 4,855,888 A | 8/1989 | Henze et al. |
| 4,890,142 A | 12/1989 | Tonnel et al. |
| 4,918,026 A | 4/1990 | Kosiak et al. |
| 4,929,884 A | 5/1990 | Bird et al. |
| 4,947,101 A | 8/1990 | McVey |
| 4,948,645 A | 8/1990 | Holzinger et al. |
| 4,948,754 A | 8/1990 | Kondo et al. |
| 5,003,244 A | 3/1991 | Davis, Jr. |
| 5,029,282 A | 7/1991 | Ito |
| 5,046,657 A | 9/1991 | Iyer et al. |
| 5,047,358 A | 9/1991 | Kosiak et al. |
| 5,111,278 A | 5/1992 | Eichelberger |
| 5,146,300 A | 9/1992 | Hamamoto et al. |
| 5,239,196 A | 8/1993 | Ikeda et al. |
| 5,268,871 A | 12/1993 | Dhong et al. |
| 5,272,614 A | 12/1993 | Brunk et al. |
| 5,283,452 A | 2/1994 | Shih et al. |
| 5,299,091 A | 3/1994 | Hoshi et al. |
| 5,305,192 A | 4/1994 | Bonte et al. |
| 5,309,324 A | 5/1994 | Herandez et al. |
| 5,352,942 A | 10/1994 | Tanaka et al. |
| 5,391,904 A | 2/1995 | Asami et al. |
| 5,399,898 A | 3/1995 | Rostoker |
| 5,410,467 A | 4/1995 | Smith et al. |
| 5,412,239 A | 5/1995 | Williams |
| 5,422,562 A | 6/1995 | Mammano et al. |
| 5,438,499 A | 8/1995 | Bonte et al. |
| 5,439,162 A | 8/1995 | George et al. |
| 5,453,953 A | 9/1995 | Dhong et al. |
| 5,468,984 A | 11/1995 | Efland et al. |
| 5,475,296 A | 12/1995 | Vinsant et al. |
| 5,479,089 A | 12/1995 | Lee |
| 5,481,178 A | 1/1996 | Wilcox et al. |
| 5,503,286 A | 4/1996 | Nye, III et al. |
| 5,514,947 A | 5/1996 | Berg |
| 5,521,426 A | 5/1996 | Russell |
| 5,528,480 A | 6/1996 | Kikinis et al. |
| 5,546,297 A | 8/1996 | Duley |
| 5,552,694 A | 9/1996 | Appeltans |
| 5,578,916 A | 11/1996 | Muterspaugh |
| 5,594,631 A | 1/1997 | Katoozi et al. |
| 5,610,452 A | 3/1997 | Shimer et al. |
| 5,610,503 A | 3/1997 | Fogg et al. |
| 5,612,553 A | 3/1997 | Arakawa |
| 5,614,762 A | 3/1997 | Kanamori et al. |
| 5,615,477 A | 4/1997 | Sweitzer |
| 5,646,513 A | 7/1997 | Riggio, Jr. |
| 5,659,950 A | 8/1997 | Adams et al. |
| 5,665,991 A | 9/1997 | Efland et al. |
| 5,671,121 A | 9/1997 | McMahon |
| 5,672,894 A | 9/1997 | Maeda et al. |
| 5,675,240 A | 10/1997 | Fujisawa et al. |
| 5,677,618 A | 10/1997 | Fiez et al. |
| 5,677,619 A | 10/1997 | Doluca |
| 5,684,305 A | 11/1997 | Pearce |
| 5,684,328 A | 11/1997 | Jin et al. |
| 5,723,974 A | 3/1998 | Gray |
| 5,731,223 A | 3/1998 | Padmanabhan |
| 5,744,843 A | 4/1998 | Efland et al. |
| 5,751,140 A | 5/1998 | Canter |
| 5,757,168 A | 5/1998 | DeVale |
| 5,777,362 A | 7/1998 | Pearce |
| 5,777,383 A | 7/1998 | Stager et al. |
| 5,793,126 A | 8/1998 | Gray |
| 5,801,091 A | 9/1998 | Efland et al. |
| 5,814,844 A | 9/1998 | Nagata et al. |
| 5,818,090 A | 10/1998 | Kimura |
| 5,834,849 A | 11/1998 | Lane |
| 5,847,951 A | 12/1998 | Brown et al. |
| 5,859,474 A | 1/1999 | Dordi |
| 5,903,058 A | 5/1999 | Akram |
| 5,914,873 A | 6/1999 | Blish, II |
| 5,945,730 A | 8/1999 | Sicard et al. |
| 5,945,872 A | 8/1999 | Robertson et al. |
| 5,950,072 A | 9/1999 | Queyssac |
| 5,951,804 A | 9/1999 | Kweon et al. |
| 5,952,726 A | 9/1999 | Liang |
| 5,953,214 A | 9/1999 | Dranchak et al. |
| 5,959,442 A | 9/1999 | Hallberg et al. |
| 5,959,443 A | 9/1999 | Littlefield |
| 5,969,513 A | 10/1999 | Clark |
| 5,969,514 A | 10/1999 | Merrill |
| 6,020,613 A | 2/2000 | Udomoto et al. |
| 6,020,729 A | 2/2000 | Stratakos et al. |
| 6,025,618 A | 2/2000 | Chen |
| 6,028,417 A | 2/2000 | Ang et al. |
| 6,031,361 A | 2/2000 | Burstein et al. |
| 6,037,677 A | 3/2000 | Gottschall et al. |
| 6,041,013 A | 3/2000 | Kohno |
| 6,075,710 A | 6/2000 | Lau |
| 6,084,266 A | 7/2000 | Jan |
| 6,100,591 A | 8/2000 | Ishii |
| 6,100,676 A | 8/2000 | Burstein et al. |
| 6,133,634 A | 10/2000 | Joshi |
| 6,150,724 A | 11/2000 | Wenzel et al. |
| 6,159,841 A | 12/2000 | Williams et al. |
| 6,160,441 A | 12/2000 | Stratakos et al. |
| 6,180,265 B1 | 1/2001 | Erickson |
| 6,184,555 B1 | 2/2001 | Tihanyi et al. |
| 6,198,261 B1 | 3/2001 | Schultz et al. |
| 6,225,795 B1 | 5/2001 | Stratakos et al. |
| 6,268,716 B1 | 7/2001 | Burstein et al. |
| 6,271,060 B1 | 8/2001 | Zandman et al. |
| 6,278,264 B1 | 8/2001 | Burstein et al. |
| 6,287,893 B1 | 9/2001 | Elenius et al. |
| 6,331,455 B1 | 12/2001 | Rodov et al. |
| 6,400,126 B1 | 6/2002 | Zuniga et al. |
| 6,429,630 B2 | 8/2002 | Pohlman et al. |
| 6,441,487 B2 | 8/2002 | Elenius et al. |
| 6,462,522 B2 | 10/2002 | Burstein et al. |
| 6,476,486 B1 | 11/2002 | Humphrey et al. |
| 6,477,079 B2 | 11/2002 | Kaneko et al. |
| 6,489,678 B1 | 12/2002 | Joshi |
| 6,492,738 B2 | 12/2002 | Akram et al. |
| 6,501,166 B2 | 12/2002 | Wood et al. |
| 6,512,253 B2 | 1/2003 | Watanabe et al. |
| 6,525,516 B2 | 2/2003 | Schultz et al. |
| 6,559,684 B2 | 5/2003 | Goodfellow et al. |
| 6,580,258 B2 | 6/2003 | Wilcox et al. |
| 6,693,361 B1 | 2/2004 | Siniaguine et al. |
| 6,700,209 B1 | 3/2004 | Raiser et al. |
| 6,965,502 B2 | 11/2005 | Duffy et al. |
| 6,984,792 B2 | 1/2006 | Brofman et al. |
| 6,992,384 B2 | 1/2006 | Joshi |
| 2001/0015497 A1 | 4/2001 | Zhao et al. |
| 2001/0038277 A1 | 11/2001 | Burnstein et al. |
| 2002/0017697 A1 | 2/2002 | Kitamura et al. |
| 2008/0185736 A1 | 8/2008 | Lin |
| 2008/0197172 A1 | 8/2008 | Reiber |

OTHER PUBLICATIONS

Linear Technology, "Offline Switching Regulator," (product description brochure) LT1103/LT1105, Rev D 2K, Linear Technology Corporation 1992, 32 pgs [1241–1272].

Abdellatif Elmoznin et al., "The Smart Power High–Side Switch: Description of a Specific Technology, Its Basic Devices, and Monitoring Circuitries," IEEE Transactions on Electron Devices, vol. 37, No. 4, Apr. 1990, pp. 1154–1161.

Alain Dravet, Didier Desplan, Nathalie Haese and Pierre Alain Rolland, "Flip Chip and Tab Interconnects for Millimeter Wave MMICs: A Comprehensive Study," GAAS 98, Amsterdam, 1998, pp. 656–661.

Andreas Schubert et al., "Do Chip Size Limits Exist for DCA?," IEEE Transactions on Electronics Packaging Manufacturing, Oct. 1999, vol. 22 No. 4, pp. 255–263.

Anthony Tsui et al, "Direct Interconnect: New MOSFET Package Cuts On–Resistance," PCIM Power Electronic Systems, Aug. 1999, pp. 20–30.

Bruno Murari et al., "Smart Power ICs: Technologies and Applications," Itoh, K. et al., editors, Springer Series in Advanced Microelectronics, Springer 2002 (a corrected printing of the 1st edition from 1996), pp. 483–506.

C. A. Harper, editor, Electronic Packaging and Interconnection Handbook, McGraw–Hill, 1991, pp. 6.64–6.71.

C. G. Steyn and Jacobus D. van Wyk, "Study and Application of Nonlinear Turn–Off Snubber for Power Electronics Switches," IEEE Transactions on Industry Applications, vol. 1A–22, No. 3, May 1986, May/Jun. 1986, pp. 471–477.

Daniel R. Gamota and Cindy M. Melton, "Advanced Encapsulant Systems for Flip–Chip–on–Board Assemblies: Underfills with Improved Manufacturing Properties," IEEE Transactions on Components, Packaging, and Manufacturing Technology, Part C, vol. 21, No. 3, Jul. 1998, pp. 196–203.

David B. Lidsky, "The Conceptual–Level Design Approach to Complex Systems", (Fall 1998) (unpublished M.S. dissertation, University of California, Berkeley) (on file with author), pp. 1–220.

Dennis A. Jarc and Donald W. Novotny, "A Graphical Approach to AC Drive Classification," IEEE Transactions on Industry Applications, vol. IA–23, No. 6, Nov. 1987 Nov./Dec. 1987, pp. 1029–1035.

Donald P. Seraphim, et al., Priniciples of Electronic Packaging, McGraw–Hill, 1989, pp. 595–598.

Ernst Habekotté et al., "A Coplanar CMOS Power Switch," IEEE Journal of Solid–State Circuits, vol. SC–16, No. 3, Jun. 1981, pp. 212–226.

Eugene R. Hnatek, Integrated Circuit Quality and Reliability, second edition, Marcel Dekker, 1995, pp. 99–175, 293–307.

F. Pulvirenti et al., "Charger Power Switch for Mobile Phones," Analog and Mixed IC Design, 1997. Proceedings, 1997 2nd IEEE–CAS Region 8 Workshop on, Sep. 12–13, 1997, pp. 97–100.

Frederick E. Stykes, "Resonant–mode power supplies: a primer," 0018–9235/89/0500–0036, IEEE Spectrum, May 1989, vol. 26, Issue: 5, pp. 36–39.

Gonzalo Casaravilla and Fernando Silveira, "Emitter Drive: A Technique to Drive a Bipolar Power Transistor Switching at 100kHz", Colloquium in South America, 1990., Proceedings of the 1990 IEEE, pp. 188–192.

Grace O'Malley, "The Importance of Material Selection for Flip Chip on Board Assemblies," IEEE Transactions on Components, Packaging, and Manufacturing Technology, Part B, vol. 17, No. 3, Aug. 1994, pp. 248–255.

H. W. van der Broeck et al., "On the steady–state and dynamic characteristics of bipolar transistor power switches in low–loss technology," Electric Power Applications, IEE Proceedings B 132, Sep. 1985 vol. 132, Issue:5, pp. 251–259 IEE Proceedings, vol. 132, Pt. B, No. 5, Sep. 1985, pp. 251–259.

IEEE Standard Dictionary of Electrical & Electronics Terms, Second Edition Revised and Expanded, IEEE Std 100–1977, Published by The Institute of Electrical and Electronics Engineers, Inc. 1977, p. 197—dominant mode through dot signal; p. 510—potier reactance through power active; p. 694—sweep–delay accuracy through switchboard lamp. (6 pages).

IEEE Standard Dictionary of Electrical and Electronics Terms, ANSI/IEEE Std. 100–1988 Fourth Edition, 1988, published by the Institute of Electrical and Electronics Engineers, Inc., p. 287—dopant through double circuit systems; p. 717—potentiometer, grounded through power; p. 718—power, active through power, active; p. 728—power rectifier transformer through power system emergency; p. 972—sweep, free–running through switchboard cord. (9 pages).

Intel®, "Mobile Pentium® II Processor at 233 MHz, 266 MHz, and 300 MHz," Intel Corporation 1998, Order No. 243669–002. (75 pages).

Intel®, "Pentium® III Processor for the PGA370 Socket at 500 MHz to 1.13 GHz," Datasheet, Revision 8, Jun. 2001, Document No. 245264–08, (94 pages).

IPIRA Office of Intellectual Property & Industry Research Alliances University of California, Berkeley, UC Patent Policy, Sep. 4, 1997, www. ucop.edu/ot/genresources/pat–pol_97.html. (5 pages).

J. Fjelstad, et al., "Compliancy Modeling of an Area Array Chip Scale Package", Proceedings, Surface Mount International, San Jose, CA, Sep. 10–12, 1996, vol. I, pp. 236–243.

J. Giesler et al., "Flip Chip on Board Connection Technology: Process Characterization and Reliability," IEEE Transactions on Components, Packaging, and Manufacturing Technology, Part B, vol. 17, No. 3, Aug. 1994, pp. 256–263.

J. S. T. Huang et al., "VIB–3 Bidirectional Lateral Insulated Gate Transistors Operated in Controlled Latchup Mode," IEEE Transactions on Electron Devices, vol. 35, No. 12, Dec. 1988, p. 2458.

James M. Smith and Stanley M. Stuhlbarg, "Hybrid Microcircuit Tape Chip Carrier Materials/Processing Trade–Offs," IEEE Transactions on Parts, Hybrids, and Packaging, vol. 13, No. 3, Sep. 1977, pp. 257–268.

Jean–Paul Clech and Joseph Fjelstad, "Reliability Prediction Modeling Area Array CSPs," Electronic Packaging Solutions International, Inc., Jun. 1997, pp. 91–96.

John H. Lau et al., Electronic Packaging: Design, Materials, Process, and Reliability, McGraw–Hill, 1998, pp. 13–14.

John H. Lau, "Cost Analysis: Solder Bumped Flip Chip Versus Wire Bonding," IEEE Transactions on Electronics Packaging Manufacturing, vol. 23, No. 1, Jan. 2000, pp. 4–11.

John H. Lau, editor, Flip Chip Technologies, McGraw–Hill, 1995, pp. 26–28, 411–413, 499–515, 526–527.

John H. Lau, editor, Handbook of Tape Automated Bonding, Van Nostrand Reinhold, 1992, ISBN 0–442–00427–3. (336 pages).

John H. Lau, Flip Chip Technologies, McGraw–Hill, 1996, ISBN 0–07–036609–8. (298 pages).

John H. Lau, Low Cost Flip Chip Technologies for DCA, WLCSP, and PBGA Assemblies, McGraw–Hill, 2000, ISBN 0–07–135141–8. (307 pages).

John Lau et al., Electronic Packaging, Design, Materials, Process and Reliability, McGraw–Hill, 1998, ISBN 0–07–037135–0. (262 pages).

Jung H. Hur et al., "GaAs–Based Opto–Thyristor for Pulsed Power Applications," IEEE Transactions on Electron Devices, vol. 37, No. 12, Dec. 1990, pp. 2520–2525.

Ken Gilleo, "Direct Interconnect Using Polymer Bonding," IEEE Transactions on Components, Hybrids, and Manufacturing Technology, vol. 13, No. 1, Mar. 1990, pp. 229–234.

Kimihiro Muraoka et al., "Characteristics of the High–Speed SI Thyristor and Its Application to the 60–kHz 100–kW High Efficiency Inverter," IEEE Transactions on Power Electronics, vol. 4, No. 1, Jan. 1989, pp. 92–100.

Lars S. Nielsen et al., "Low–Power Operation Using self–Timed Circuits and Adaptive Scaling of the Supply Voltage," Special Issue Papers, IEEE Transactions on Very Large Scale Integration (VLSI) Systems, vol. 2, No. 4, Dec. 1994, pp. 391–397.

Lautaro D. Salazar and Phoivos D. Ziogas, "A High Frequency Two–Switch Forward Converter with Optimized Performance," Industrial Electronics Society, 1989. IECON '89., 15th Annual Conference of IEEE, Nov. 6–10, 1989, pp. 60–66 vol. 1.

Lishan Tu et al., "Performance Characteristics of the Combined Zero–Voltage Switching Inverter with the Auxiliary Input–Current Controller," Proceedings of the Power Conversion Conference—Nagaoka 1997., Aug. 3–6, 1997, vol. 2, 827–830 0/7803–3823–5/97, IEEE 1997, pp. 827–830.

Maxim, "Digitally Adjustable LCD Bias Supply," MAX749, Maxim Integrated Products (brochure) 19–0143; Rev. 1: 2/95, Feb. 1995, pp. 1–12.

McGraw–Hill Dictionary of Electronic and Electrical Engineering, McGraw–Hill Book Company, 1984, p. 164—flasher through flip chip; p. 165—flip call through flutter echo; p. 220—instantaneous companding through insulation; p. 221—insulation coordination through intensifier electrode. (5 pages).

McGraw–Hill Dictionary of Electronic and Electrical Engineering, McGraw–Hill Book Company, 1984, pp. 164 and 221. (6 pages).

McGraw–Hill Dictionary of Scientific and Technical Terms, Fourth Edition,1989, p. 556—disconformity through dishpan experiment. (4 pages).

McGraw–Hill Dictionary of Scientific and Technical Terms, McGraw–Hill Book Company, fifth edition, 1994, p. 1027. (5 pages).

McGraw–Hill Electronics Dictionary, Fifth Edition, John Markus and Neil Sclater Editors, 1994, p. 65—BT—cut crystal through bulk eraser; p. 110—concentric transmission line through confidence interval; p. 114—continuous X–rays through control system; p. 119—counter circuit through coupling coefficient; p. 207—FES through field–effect transistor; p. 230—gas cell frequency standard through gate; p. 231—gate array through G display; p. 333—mesa transistor through metal–organic vapor–phase epitaxy; p. 494—solar flare through soldering iron; p. 573—VHF antenna through videocassette recorder; p. 578—voltage generator through voltmeter. (14 pages).

McGraw–Hill Electronics Dictionary, Fifth Edition, John Markus, Neil Sclater, 1984, p. 578—voltage generator through voltmeter; p. 494—solar flare through soldering iron. (5 pages).

MOSPOWER Applications Handbook, Robin Berliner Editor, 1984, Siliconix Incorporated, p. 2–3.

Motorola, Linear/Switchmode Voltage Regulator Handbook, 1989, pp. 95–100.

National Semiconductor Corporation, "LM2650 Synchronous Step–Down DC/DC Converter", Jun. 1999. (11 pages).

National Semiconductor Corporation, LM2650 Synchronous Step–Down DC/DC Converter , Jan. 1997. (12 pages).

New Webster's Dictionary of the English Language, College Edition, 1975, p. 448—disconcerted through discrepancy; p. 821—jupan through jute; p. 1137—plainsman through plane tree; p. 1786—witchery through without. (7 pages).

O. K. Mawardi et al., "High Voltage Superconducting Switch for Power Application," IEEE Transactions of Magnetics, Vol. Mag–19, No. 3, May 1983, pp. 1067–1070.

Ole Bentz et al. "A Dynamic Design Estimation and Exploration Environment", Department of Electrical Engineering and Computer Science, University of California, Berkeley, Proceedings of the 34th Design Automation Conference, 1997. IEEE 1997, pp. 190–195.

Ole Bentz et al., "Information Based Design Environment", University of California, Berkeley, Workshop on VLSI Signal Processing, VIII, 1995. IEEE Signal Processing Society, Oct. 16–18, 1995, pp. 237–246 IEEE 1995, pp. 237–246.

Peter P. Bathasar and Eberhart Reimers, "The Integrated Power Switch," IEEE Transactions on Industry Applications, vol. 1A–12, No. 2, Mar./Apr. 1976, pp. 179–191.

Primarion® Power Code™, "Digital Multiphase Chipset*," Primarion® Wideband Power Products, Product Brief, 2003. (2 pages).

R. A. Petr, W. C. Nunnally and C. V. Smith, Jr., "Switching performance of a cryogenic silicon photoconductive power switch," J. Appl. Phys. 63 (8), Apr. 15, 1988, American Institute of Physics, pp. 2839–2847.

R. Jacob Baker et al., CMOS Circuit Design, Layout and Simulation, IEEE Press, 1998, ISBN 0–7803–3416–7. (468 pages).

R. R. Tummala et al., editors, Microelectronics Packaging Handbook, Part II: Semiconductor Packaging Chapman & Hall, 2nd edition 1997, pp. 117–119, 935–937.

R. R. Tummala, editor, Microelectronics Packaging Handbook, Van Nostrand Reinhold, 1989, pp. 364–373.

Rao R. Tummala, Microelectronics Packaging Handbook, Semiconductor Packaging, Part II, Second Edition, Kluwer Academic Publishers, Chapman & Hall, 1997, ISBN 0–412–08431–7. (535 pages).

Request for grant of a patent—The Patent Office London, Patent Application No. 9724597.1, Nov. 20, 1997, entitled "Controller For Battery–Operated Vehicle".

Richard S. Muller et al., Device Electronics for Integrated Circuits, John Wiley & Sons, second edition, 1986, pp. 106–107.

Richard S. Muller et al., Device Electronics for Integrated Circuits, Second Edition, John Wiley & Sons, Inc., 1977, ISBN 0–471–88758–7. (276 pages).

Robert B. Hood, "Proposed Integrated Circuit for Appliance or Process Control," IEEE Transactions on Industry and General Applications, vol. IGA–4, No. 5, Sep. 1968, pp. 520–526.

S. M. Varosi et al., "A Simple Remote–Controlled Power Switch for Internalized Bioelectronic Instrumentation," IEEE Transactions on Biomedical Engineering, Aug. 1989, vol. 36, Issue:8, pp. 858–860.

Scott E. Deering and Julian Szekely, "Mathematical Modeling of Alternative Pad Designs in Flip–Chip Soldering Processes," Journal of Electronic Materials, vol. 23, No. 12, Dec. 1994, pp. 1325–1334.

Shin'ichiro Mutoh et al., "Design Method of MTCMOS Power Switch for Low–Voltage High–Speed LSIs,"Design Automation Conference, 1999. Proceedings of the ASP–DAC '99. Asia and South Pacific Jan. 18–21, 1999, 113–116 vol. 1.

Sidney Soclof, Analog Integrated Circuits, Prentice–Hall, Inc., 1985, ISBN 0–13–032772–7. (264 pages).

Sidney Soclof, Analog Integrated Circuits, Prentice–Hall Series in Solid State Physical Electronics, Prentice Hall, Inc. 1985, p. 44. (4 pages).

Siliconfareast.com, "Chip–on–Board (COB); Direct Chip Attachment (DCA)," http://www.siliconfareast.com/cob.htm, downloaded Mar. 3, 2010. (3 pages).

Stephen Hobrecht, "An Intelligent BiCMOS/DMOS Quad 1–A High–Side Switch," IEEE Journal of Sold–State Circuits, vol. 25, No. 6, Dec. 1990, pp. 1395–1402.

Sue Chen and Joós Géza, "Series and Shunt Active Power Conditioners for Compensating Distribution System Faults," IEEE Canadian Conference on Electrical and Computer Engineering, Conference Proceedings vol. 2, May 7–10, 2000, pp. 1182–1186.

Sujit K. Biswas et al., "IGBT–Bipolar Discrete Darlington Power Switches: Performance and Design", Industry Applications Society Annual Meeting, 1991., Conference Record of the 1991 IEEE, Sep. 28–Oct. 4, 1991, vol. 2, pp. 1483–1489.

Suwana Jittinorasett, "UBM Formation on Single Die/Dice for Flip Chip Applications," (Aug. 25, 1999) (unpublished M.S. dissertation, Virginia Polytechnic Institute and State University), http://scholar.lib.vt.edu/theses/available/etd–082699–110209/unrestricted/Final.pdf. pp. 1–89.

T. A. Smith and S. Dimitrijev, "Using the On–Resistance of a Power MOSFET to Control a DC–DC Converter," Circuits and Systems, 1998. IEEE APCCAS 1998. The 1998 IEEE Asia–Pacific Conference on, Nov. 24–27, 1998, pp. 731–733.

T. Paul Chow and B. Jayant Baliga, "A New Hybrid VDMOS–LIGBT Transistor," IEEE Electron Device Letters, vol. 9, No. 9. Sep. 1988, pp. 473–475.

T. Tsen et al., "A Low Power 16K GaAs HIMESFET static RAM with Built–in Redundancy," Gallium Arsenide Integrated Circuit (GaAs IC) Symposium, 1990, Oct. 7–10, 1990, pp. 155–157 Technical Digest 1990., 12th Annual Rockwell International Corporation MTC/CSP, GaAs IC Symposium, pp. 155–157.

Tessera: System Building Block, "The Tessera μBGA package," Product Description. 1994. (6 pages).

The American Heritage Dictionary, Second College Edition, 1982, p. 817—motionless through mountaineer; p. 1384—wind instrument through wing footed. (5 pages).

The Authoritative Dictionary of IEEE Standards Terms, Seventh Edition, IEEE, 2000, p. 275—day night sound level through d–display. (6 pages).

The IEEE Standard Dictionary of electrical and Electronics Terms, Sixth Edition, IEEE Std 100–1996, 1996, p. 313—done correct through dose equivalent; p. 536—integer arithmetic through integrated circuit; p. 537—integrated Civil Engineering System through integration loss; p. 557—isochronous service octet through isolation; p. 650—metal—enclosed power switchgear through metal–oxide semiconductor; p. 808—power selsyn through power transfer relay; p. 818—principal voltage through print server; p. 1054—strip–type transmission line through structure chart; p. 1059—substitute character through subtransient internal voltage. (12 pages).

The IEEE Standard Dictionary of electrical and Electronics Terms, Sixth Edition, IEEE Std 100–1996, 1996, p. 313—done correct through dose equivalent; p. 408—fill area through filter; p. 409—filter, active through filter transmission band; p. 526—input queue through insertion loss ripple; p. 535—insulation, temperature class ratings through integer adjectives; p. 536—integer arithmetic through integrated circuit; p. 537—integrated Civil Engineering System through integration loss; p. 544 interlacing impedance voltage through intermediate frequency; p. 557—isochronous service octet through isolation; p. 650—metal—enclosed power switchgear through metal–oxide semiconductor; p. 734—output signal through overcurrent; p. 808—power selsyn through power transfer relay; p. 818—principal voltage through print server; p. 1054—strip–type transmission line through structure chart; p. 1059—substitute character through subtransient internal voltage.

Page 1095—10BASE2 through terminal; p. 1096—terminal adapter through terminal, remote. (20 pages).

The New IEEE Standard Dictionary of Electrical and Electronics Terms [Including Abstracts of All current IEEE Standards], 1993, p. 802—metal—enclosed 1000 volts through metallic rectifier; p. 803—metallic rectifier cell through meter installation inspection; p. 995—power service protector through power system stabilizer. (5 pages).

Thomas M. Frederiksen, Intuitive IC Electronics, A Sophisticated Primer for Engineers and Technicians, McGraw–Hill Book Company, 1982, ISBN 0–07–021923–0. (104 pages).

Trevor A. Smith et al., "Controlling a DC–DC Converter by Using the Power MOSFET as a Voltage Controlled Resistor," IEEE Transactions on Circuits and Systems–I: Fundamental Theory and Applications, vol. 47, No. 3, Mar. 2000, pp. 357–362.

University of California Technology Transfer, UC Patent Policy 1985, Effective Nov. 18, 1985, http://www.ucop.edu/ott/genresources/pat–pol_97.html. (4 pages).

Webster's Ninth New Collegiate Dictionary, 1991, p. 1176—sub–script through substitutable. (3 pages).

Webster's Third New Collegiate International Dictionary of the English Language Unabridged, Merriam–Webster Inc., Publishers, 1993, page_altaic through altitude; p. 485—consonancy through constellate; page_continental through continuous; p. 494—continuous beam through contraction; p. 646—discomycete through discourage; p. 1275—last day through lateral line; page_mottled through mount; p. 1477—mount through mountain pride; p. 1575—on through one; page_plan through planful; p. 1730—plan through planful; page_plunge through plutonic; page_protozoacidal through provenience; p. 2300—sureness through surgeon general; p. 2620 windfallen through wind–shaken; p. 2627—wither through witted. (19 pages).

Webster's Third New International Dictionary of the English Language, Unabridged, Merriam–Webster Inc., Publishers, 1993, page_altaic through altitude; page_—amhem through array; p. 121—arrayal through arrowhead; page_—conjugal bliss through connected load; page_—continental drift through continuous; p. 494—continuous beam through contraction; page_—ed. through edict; p. 804—expurgation through extension; page_—F through face; p. 1275—last day through lateral line; page_mottled through mount; p. 1477—mount through mountain pride; p. 1575—on through one; page_plan —over frame through ovelook; p. 1608—overflow pipe through ovelook; page_—packet through pad; p. 1619—pad through paedomorphism; page_—plan through planful; p. 1307—plan through planful; page_—plunge through plutonic.
Page_—protzoacidal through provenience; p. 2280—substandard through subsumption; p. 2500—union card through united front; p. 2620 windfallen through wind–shaken; p. 2627—wither through witted. (28 pages).
William C. Dunn, "Driving and Protection of High Side NMOS Power Switches," IEEE Transactions on Industry Applications, vol. 28, No. 1, Jan./Feb. 1992, pp. 26–30.
William D. Brown, "Advanced Electronic Packaging With Emphasis on Multichip Modules," IEEE Press Series on Microelectronic Systems, Stuart K. Tewksbury, Series Editor, IEEE Computer Society Press, Oct. 13, 1998, the Institute of Electrical and Electronics Engineers, Inc. New York, pp. 784.
William G. Hawkins, "Power IC's Move Ink Jet Printers to New Performance Levels", Electron Devices Meeting, 1995, International, Dec. 10–13, 1995, pp. 959–962.
Won Namgoong et al., "SP23.2: A High–Efficiency Variable–Voltage CMOS Dynamic dc–dc Switching Regulator," IEEE International Solid–State Circuits Conference, 1997, pp. 381–381 and 489.
Wong Da Feng, "Diode as Pseudo Active Switch in High Frequency Narrowband DC/DC Converter," Power Electronics Specialists Conference, 1991. PESC '91 Record, 22nd Annual IEEE, Jun. 24–27, 1991, 182–185.
Yasuo Takahashi and Tie Gang, "Microjoining Process in Electronic Packaging and Its Numerical Analysis," Transactions of Joining and Welding Research Institute, vol. 30, (2001), No. 1, pp. 1–11.
Yida Zou et al., "In–Situ Stress State Measurements During Chip–on–Board Assembly," IEEE Transactions on Electronics Packaging Manufacturing, vol. 22, No. 1, Jan. 1999, pp. 38–52.
U.S. Appl. No. 09/498,297, Burnstein et al., filed Feb. 4, 2000, issued as USP 6278264; USPTO File History.
U.S. Appl. No. 09/892,233, Burnstein et al., filed Jun. 26, 2001, issued as USP 6462522; USPTO File History.
Acker, Brian et al., "Synchronous Rectification with Adaptive Timing Control," Dept. of Electrical Engineering and Comp. Sciences, University of California, Berkeley 1995. IEEE ISBN 0 7803 2730 6. pp. 88–95.
Dixon, Lloyd, "Average Current Mode Control of Switching Power Supplies," Unitrode Switching Regulated Power Supply Design Seminar Manual, Unitrode Corporation, C1–1 to C1–14, 1991 (16 pages).
Dixon, Lloyd, "Switching Power Supply Topology Review," Unitrode Switching Regulated Power Supply Design Seminar Manual, Unitrode Corporation, P1–1 to P1–12, 1991. (14 pages).

Farley, B. G. and Clark, W.A. "Simulation of Self–Organized Systems by Digital Computer," Lincoln Laboratory at MIT, Cambridge, MA, 1954. Downloaded by licensed user from IEEE Xplore on Dec. 15, 2008, 9 pgs [1035–1043].
Kassakian et al., "Form and Function: An Overview, Chapter 2; 2.3 DC/DC Converters" Principles of Power Electronics, Addison–Wesley Publishing Co. pp. 20–23, 1991.
Kassakian et al., "Discrete–Time or Sampled–Data models," Prinicples of Power Electronics, Addison–Wesley Publishing Co., Chapter 12, Sec. 12.5, pp. 313–315, 1991.
Kassakian et al., "Dynamics and Control: An Overview," Principles of Power Electronics, Addison–Wesley Publishing Co., Chapter 11, pp. 253–298, 1991.
Kassakian et al., "Feedback Control Design," Principles of Power Electronics, Addison–Wesley Publishing Co., Chapter 14, pp. 365–402, 1991.
Kassakian et al., "High–Frequency Switching dc/dc Converters," Principles of Power Electronics, Addison–Wesley Publishing Co., Chapter 6, pp. 103–137, 1991.
Sridharan, G. Oct. 1990. "Transformerless DC/DC Converter for Production of High Voltage," downloaded on Dec. 11, 2008 from IEEE Xplore, by licensed user, 3 pgs [1709–1711].
Stratakos, Anthony J. (1998) "High–Efficiency Low–Voltage DC–DC Conversion for Portable Applications," Disscrtation No. UMI 9923062, Univ. CA, Berkeley, Dec. 2, 1998, 251 pgs [1800–2050].
Wei, Gu–Yeon and Horowitz, Mark, "A Low Power Switching Power Supply for Self–Clocked Systems," Computer Systems Laboratory, Stanford University, CA, funding provided under ARPA, contract #J–FBI–92–194, ISLPED 1996 Monterey, California, 5 pgs [4822–4826].
PCT International Preliminary Examination Report dated Mar. 28, 2002 issued in PCT/US2001/03756 (WO2001–57608) [1670–1674].
PCT International Search Report dated May 17, 2001 issued in PCT/US2001/03756 (WO2001–57608) [1670–1674].
"FC–09A 2×2 mm MOSFET BGA Tape and Reel Dimensions," Mar. 2000, Rev A, Fairchild Semiconductor International. 4 pgs.
"FDZ202P: P–Channel 2.5V Specified Power Trench™ BGA MOSFET," Nov. 1999 Advance Information, Fairchild Semiconductor Corporation. 4 pgs.
"FDZ204P: P–Channel 2.5V Specified Power Trench® BGA MOSFET," Dec. 2000 Preliminary, Fairchild Semiconductor Corporation. 4 pgs.
"FDZ5047N: 30V N–Channel Logic Level Power Trench® BGA MOSFET," Dec. 1999 Advance Information, Fairchild Semiconductor Corporation. 4 pgs.
Allen, J.J. et al. (1998) "Integrated Micro–Electro–Mechanical Sensor Development for Inertial Applications," *1998 IEEE*, 0–7803–4330–1/98, 8 pgs [1021–1028].
Arbetter, Barry et al. (1997) "Control Method for low–Voltage DC Power Supply in Battery–Powered Systems with Power Management," *IEEE Power Electronics Specialists Conference*, St. Louis, MS, Jun. 22, 1997, 6 pgs [859–864].
Arbetter, Barry et al. (1997) "DC–DC Converter with Fast Transient Response and high Efficiency for Low–Voltage Microprocessor Loads," *IEEE Power Electronics Specialists Conference*, St. Louis, MS, Jun. 22–27, 1997, 8 pgs [865–872].
Arzumanyan, Aram, et al., "Flip Chip Power MOSFET: A New Wafer Scale Packaging Technique," As presented at ISPSD, Jun. 2001, International Rectifier Corporation. 4pgs.

Asada, G. et al. (1997) "Low Power Wireless Communication and Signal Processing Circuits for Distributed–Microsensors," *1997 IEEE Intnl Symposium on Circuits and Systems*, Jun. 9–12, 1997, Hong Kong, 2817–2820, 4pgs [940–943].

Atencio, S. et al. (1999) "Design, Analysis, and Fabrication of the APT Cavities," *Proceedings of the 1999 Particle Accelerator Conference*, New York, 965–967, 3 pgs [1018–1020].

Bai, John G. et al. (2003) "Flip–Chip on Flex Integrated Power Electronics Modules for High–Density Power Integration," IEEE Transactions on Advanced Packaging, vol. 26, No. 1, Feb. 2003, 6 pgs [54–59].

Bandyopadhyay, A. et al. (1998) "A Simplified Approach to Time–Domain Modeling of Avalanche Photodiodes, "*IEEE Journal of Qunatum Electronics*, vol. 34, No. 4, Apr. 1998, 691–699, 9 pgs [989–997].

Bentz, Ole et al. (1995) "Information Based Design Environment," *1995 IEEE* No. 0–7803–2612–1/95, 10 pgs [1627–1636].

Bentz, Ole et al. (1997) "A Dynamic Design Estimation and Exploration Environment," ACM, Inc., DAC97, Anaheim, CA, ACM 0–89791–920–3/07/06, pp. 190–195, Jun. 9–13, 1997, 6 pgs [1607–1612].

Boustedt, Katarina (1998) "GHz Flip Chip—An Overview," *1998 IEEE*, No. 0–7803–4526–6/98, 6 pgs.

Bradenburg, S. and Yeh, S. (1998) "Electromigration Studies of Flip Chip Bump Solder Joints," Delphi Delco Electronics Systems, Kokomo, Indiana. In Proceedings Surface Mount International, 1998, San Jose, Calif., Aug. 23, 1998. 8 pgs.

Brodersen, R. et al. (1994) "Research Challenges in Wireless Multimedia," *PIMRC, 1994* P1.1, 1–5, 5 pgs [948–952].

Bult, K. et al. (1996) "Low Power Systems for Wireless Microsensors," ISPLED 1996, Monterey, CA, 1996, 17–21, 5 pgs [935–939].

Burd, Thoams D. et al. (2000) "A Dynamic voltage Scaled Microprocessor System," *IEEE Journal of Solid–State Circuits*, vol. 35, No. 11, Nov. 2000, 10 pgs [1712–1721].

Burd, Thomas D. et al., "A Dynamic Voltage Scaled Microprocessor System," Solid–State Circuits Conference, Feb. 7–9, 2000. Paper 17.4. ISSCC. 2000 IEEE International. 20pp.

Burdio, Jose et al. (1995) "A Unified Discrete–Time State–Space Model for Switching CovertErs," *IEEE Transactions on Power Electronics*, vol. 10, No. 6, Nov. 1995, 14 pgs [873–886].

Burnstein, Amit et al. (1995) "Mixed Analog–Digital highly–Sensitive Sensor Interface Circuit for Low–Cost Microsensors," Ithe 8th Intnl Conf on Solid–State Sensors and Actuators and Eurosensors, Stockholm, Sweden, Jun. 25–29, 1995, 162–165, 4 pgs [944–947].

Burstein, Andrew et al. (1995) "The InfoPad user Interface," *IEEE 1995*, 1063–6390/159–162, 4 pgs [967–970].

Chandrakasan, Anantha et al. (1994) "A Low Power Chipset for a Portable Multimedia I/O Termianl," *IEEE Journal of Solid–State Circuits*, vol. 29, No. 12, Dec. 1994, 1415–1428, 12 pgs [892–905].

Chandrakasan, Anantha et al. (1994) A Low Power Chipset for Portable Multimedia Applications, *1994 IEEE International Solid–State Circuits Conference*, ISSCC94, Session 5, Technology Directions: Low Power Technology, Paper WP5.1, Feb. 16, 1994, 2 pgs [887–888].

Chandrakasan, Anantha et al. (1994) "Design of Portable Systems," *IEEE 1994 Custom Integrated circuits Conference*, No. 0–7803–1886–2/94, 8 pgs [1792–1799].

Chetty, P.R.K. (1986) "Switch–Mode Power Supply Design," *TAB Professional and Reference Books*, Division of TAB Books, Inc., 1986, 5 pgs [971–975].

Clark, W.A. and Pelosi, W. (1990) "Area Distributed Soldering of Flexible and Rigid Printed Circuit Boards," *1990 IEEE*, 0148–6411/901200–0698, 6 pgs [1003–1008].

Cooley, G. M. and Fiez, Terri (1995) "PWM and PCM Techniques for Control of Digitally Programmable Switching Power Supplies," *1995 IEEE*, 0–7803–2570–2/95, 1114–1117, 4 pgs [1044–1047].

Dancy, Abram and Chandrakasan, Anantha (1997) "Ultra Low Power Control Circuits for PWM Converters," *1995 IEEE*, 0–7803–3840–5/97, 21–27, Jun. 21–27, 1997, 7 pgs [1152–1158].

Dancy, Abram P. (1996) "Power Supplies for Ultra Low Power Applications," Archives of the Massachussets Institute of Technology, Oct. 29, 1997, 104 pgs [1048–1151].

Darwish, M. et al. (1998) "Scaling Issues in Lateral power MOSFETs," *Proc of 1998 Intnl Symposium on Power Semiconductor Devices and ICs*, Kyoto, 11.33/329–332, 4 pgs [1159–1162].

élantec (1996) EL7560C Programmable CPU Power Supply Unit, élantec High Performance Analog Integrated Circuits, Inc. (product description brochure) Jul. 1996, Rev. A, 12 pgs [1202–1213].

élantec (2000) EL7556AC Programmable CPU Power Supply Unit, élantec High Performance Analog Integrated Circuits, Inc. (product description brochure) Feb. 28, 2000, 13 pgs [1163–1175].

élantec (2001) EL7556BC Integrated Adjustable 6 Amp Synchronous Switcher, élantec High Performance Analog Integrated Circuits, Inc. (product description brochure) Oct. 5, 2001, 13 pgs [1176–1188].

Farley, B.G. et al. (1962) "Computer Techniques for the study of Patterns in the Electrocephalogram," *IRE Transactions on Bio–Medical Electronics*, Jan. 1962, 9 pgs [1009–1017].

Furukawa, T. et al. (1997) Accelerated Gate–Oxide Breakdown I Mixed–Voltage I/O Circuits, *1997 IEEE*, 0–7803–3575–9/97, Apr. 8, 1997, 169–173, 5 pgs [998–1002].

Gilbert, P. et al. (1998) "A high Performance 1.5V, 0.10μm Gate Length CMOS Technology with Scaled copper Metallization," *1998 IEEE*, IEDM 98–1013, 4 pgs [978–981].

Goodman, James et al. (1998) "An Energy/Security Scalable Encryption Processor Using an Embedded Variable Voltage DC/DC Converter," *IEEE Jrnl of Solid–State Circuits*, vol. 33, No. 11, 1799–1809, Nov. 1998, 11 pgs [1390–1400].

Griffin, Timothy E. (1995) "Multichip Modules Including Processing, A Literature Survey," Army Research Laboratory, ARL–MR–257, No. 19950906–048, Aug. 1995, 26 pgs [1401–1426].

Gupta, Tarun et al. (1997) "Implementation of a Fuzzy Controller for DC–DC Converters Using an Inexpensive 8–b Microcontroller," *IEEE Trans on Industrial Electronics*, vol. 44, No. 5, Oct. 1997, 9 pgs [1427–1435].

Gutnik, Vadim and Chandrakasan, Anantha (1997) "Embedded Power Supply for Low–Power DSP," *IEEE Trans on Very Large Scale Integration (VLSI) Systems*, vol. 5, No. 4, Dec. 1997, 11 pgs [1436–1446].

Haralson, II et al. (1997) "Numerical Simulation of Avalanche Breakdown with In–P–InGaAs SAGCM Standoff Avalanche Photodiodes," *Journal of Lightwave Technology*, vol. 15, No. 11, Nov. 1997, 4 pgs [1029–1032].

HIP5020 Integrated–Power Buck Converter Controller with Synchronous Rectification, Harris Semiconductor (product description brochure) File No. 4253, Jan. 1997 (19–0146: Rev. 2: 5/94), 16 pgs [1214–1229].

Huliehel, F. and Ben_Yaakow, S. (1989) "Low–Frequency Sampled–Data Models of Switched Mode DC–DC Converters," *1989 IEEE*, CH2721–9/89/0000–0492, 8 pgs [1447–1454].

Joshi et al. (2000) "MOSFET BGA Package," *2000 IEEE*, Electronic Components and Technology Conference, No. 0–7803–5911–9/00, 4 pgs.

Jung, Erik et al. (1999) "Flip Chip Contacts for High Current Conducting Assemblies," *1999 IEEE*, 0–7803–5502–4/99, 7 pgs [1460–1466].

Jung, Sang–Hwa et al. (1999) "An Integrated CMOS DC–DC Converter," *1998 IEEE*,0–7803–5421–4/99, 5 pgs [1455–1459].

Klein, Jon (2000) "Bumped–wafer technology meets MOSFET challenges," retrieved from Electronic Products.com at <http://ww2.electronicproducts.com/printarticle.aspx?articleURL+SEPFAI1. SEP2000>, downloaded from internet on May 4, 2009, 4 pgs.

Koburger C. et al. (1994) "Simple, Fast, 2.5–V CMOS Logic with 0.25–µm Channel Lengths and Damascene interconnect," *1994 Symposium on VLSI Technology Digest of Technical Papers*, 7A.3, 0–7803–19212–4/94–IEEE, 2 pgs [1033–1034].

Kukrer, Osman (1996) "Discrete–Time Current Control of Voltage–Fed Three–Phase PWM," *IEEE Trans on Power Electronics*, vol. 11, No. 2, Mar. 1996, 10 pgs [1597–1606].

Kurata et al. (2000) "Over–coated Flip–chip Fine Package Development for MCM Fabricated with Si IC and GaAs MMIC," *2000 IEEE*, Electronic Components and Technology Conference, No. 0–7803–5911–9/00, 6 pgs.

Kurata et al. (2001) "Dual Operational Amplifier using Flip–chip Fine Package of 1.0×1.0×0.6–mm with 8–pin counts," *2001 IEEE*, Electronic Components and Technology Conference, No. 0–7803–7038–4/01, 5 pgs.

Lau, John H. Ed. (1994)"Chip On Board Technologies for Multichip Modules," Chapman & Hall, New York, NY, International Thompson Publishing. ISBN 0442014414. 1994.(299 pgs).

Lidsky, D. and Rabaey J.M. (1994) "Low Power Design of Memory Intensive Functions Case Study: Vector Quantization," *1998 IEEE*, No. 0–7803–2123–5/94, 10 pgs [1637–1646].

Lidsky, D. and Rabaey J.M. (1996) "Early Power Exploration—A World Wide Web Application," *AMC, Inc., 33rd Design Automation Conference*, DAC96–06/96, ACM 0–89791–779–0/96/0006, 6 pgs [1621–1626].

Lidsky, D. and Rabaey J.M. (1994) "Low–Power Design of Memory Intensive Functions," *1994 IEEE Symposium on Low Power Electronics*, No. 2.4, 2 pgs [1647–1648].

Liffring, Mark (1985) "Spice Compatible Sampled–Data Models for Switching Regulators," *Society of Automotive Engineers, Inc.*, SAE/P–85/164, 6 pgs [1649–1654].

Linear Technology (1993) "High Efficiency Synchronous Step–Down Switching Regulators," (product description brochure) LTC1148, LTC1148–3.3/LTC1148–5, 2 pgs [1273–1274].

Liu et al. (2000) "Chip–Scale Packaging of Power Devices and its Application in Integrated Power Electronics Modules," *2000 IEEE*, Electronic Components and Technology Conference, No. 0–7803–5911–9/00, 8 pgs.

Liu, Xingsheng (2001) "Processing and Reliability Assessment of Solder Joint Interconnection for Power Chips," Dissertation submitted to Virginia Polytechnic Institute and State University, Feb. 27, 2001, pp. i–xxvii and 1–265.

Liu, Xingsheng, et al. "Chip–Scale Packaging of Power Devices and Its Application in Integrated Power Electronics Modules," IEEE Transactions on Advanced Packaging, vol. 24, No. 2, May 2001, 1521–3323(01)04492–6. 10 pgs. Downloaded on May 5, 2009.

Liu, Xingsheng, et al. "Three–Dimensional Flip–Chip on Flex packaging for Power Electronics Applications," IEEE Transactions on Advanced Packaging, vol. 24, No. 1, Feb. 2001, 1521–3323(01)00558–5. 9 pgs. Downloaded on May 4, 2009.

Loriferne, Bernard (1982) "Analog–Digital and Digital–Analog Conversion," *Heyden & Son, Ltd.*, No. ISBN 0–85501–497–0, 4 pgs [1655–1658].

Mao, R.S. et al. (1992) "A New On–Chip Voltage Regulator for High Density CMOS DRAMS," *1992 Symposium on VLSI Circuits Digest of Technical Papers*, 11–2,1992 IEEE, 92CH3173–2/92/0000–0108, 2 pgs [1659–1660].

Martin, T.W. and Ang, S.S. (1995) "Digital Control for Switching Converters," *IEEE Symposium on Industrial Electronics*, vol. 2 of 2, Jul. 10–14, 1995, 6 pgs [1661–1666].

Maxim (1994) "Triple–Output Power–Supply Power–Supply controller for Notebook computers," MAX782, Maxim Integrated Products (brochure) 19–0146; Rev. 2, Jun. 1997, 2 pgs. [1300–1301].

Maxim (1997) "High–Speed Step–Down Controllers with Synchronous Rectification for CPU Power," MAX1624/MAX1625, Maxim Integrated Products (brochure) 19–1227; Rev. 1, Jun. 1997, 25 pgs. [1275–1299].

Miller, L. F. (1969) "Controlled Collapsable Reflow Chip Joining*," IBM Components Division Laboratory, East Fishkill, NY, May 1969, pp. 239–250. 12 pgs.

Mitchell, Daniel (1998) "DC–DC Switching Regulator Analysis," Basic Switching Regulator Topologies, p. 9, ISBN 0–07–042597–3, McGraw Hill, Inc., 1988, 3 pgs [1667–1669].

Motorola (1996) "DC–to–DC Converter Control Circuits," Motorola, Inc. ((product description brochure) MC34063 A/D, MC33063A, Rev. 5, 13 pgs [1302–1314].

Narayanaswamy, S. et al. (1996) "A low–power, lightweight unit to provide ubiquitous information access Application and Network Support for InfoPad," *IEEE Personal communications*, Apr. 1996, 4–17, 14 pgs [913–926].

Nelson, Carl (1986) "LT1070 Design Manual," Linear Technology Application Note 19, Jun. 1986, No. AN19–1, 3 pgs [856–858].

Paulasto, Mervi and Hauck, Torsten, "Flip Chip Die Attach Development for Multichip Mechatronics Power Packages," Motorola GmbH, Advanced Interconnect Systems Laboratory—Europe, Munchen, Electronics Manufacturing Technology Symposium, 1999. Twenty–Fourth IEEE/CPMT, Oct. 18, 1999–Oct. 19, 1999. 0–7803–5502–4/99. 7 pgs. Downloaded on May 5, 2009.

Pehlke, D.R. et al. (1997) "Extremely High–Q Tunable Inductor for Si–Based RF Integrated Circuit Applications," *1997 IEEE, 64 IEDM 97–63, 3.4.1*, Dec. 7–10, 1997, 4 pgs [927–930].

Pehlke, D.R. et al. (1998) "High–Frequency Application of MOS Compact Models and their Development for Scalable RF Model Libraries," *1998 IEEE Custom Integrated Circuits Conference*, 1998, 219–222, 4 pgs [931–934].

Pienimaa, S. and Martin, N. (2001) "High Density Packaging for Mobile Terminals," *2001 IEEE,* Electronic Components and Technology Conference, No. 0–7803–7038–4/01, 8 pgs.

Poulton, Ken et al. (2002) "A 4GSample/s 8b ADC in 0.35μm CMOS," *2002 IEEE International Solid–State Circuits Conference,* 2002, Session 10, High–Speed SDCs, 10.1, 3 pgs [889–891].

Poulton, Ken et al. (2002) "A 4GSample/s 8b ADC in 0.35μm CMOS," 2002 IEEE International Solid–State Circuits Conference, 2002, Session 10, High–Speed SDCs, 10.1, Visuals Supplement, 5 pgs [953–957].

Razavi, Behzad (1995) "Principles of Data Conversion System Design," *IEEE Circuits and Systems Society, IEEE Press,* No. PC4465, 5 pgs [1676–16080].

Saint, Christopher and Judy (2002) "IC Layout Basis, A Practical Guide," *McGraw–Hill,* No. ISBN 0–07–138625–4, 5 pages [1681–1685].

Schiffer et al. (1998) "An Active Charge–Cancellation System for Switched–Capacitor Sensor Interface Circuits," *IEEE ISSCC98,* Session 17, Sensor Technology, SA 17.2, 2 pgs [911–912].

Schiffer, Brian et al. (1998) An Active Charge Cancellation System for Switched–Capacitor Sensor Interface Circuits, *IEEE Journal of Solid–State Circuits,* vol. 33, No. 12, Dec. 1998, 2134–2137, 5 pgs [906–910].

Seitzer, Dieter et al. (1983) "Electronic Analog–to–Digital Converters," *John Wiley & Sons,* No. ISBN 0 471 90198.9, 3 pgs [1690–1692].

Severns, R.P. and Bloom, Ed (1985) "Modern DC–To–DC Switchmode Power Converter Circuits," *Van Nostrand Reinhold Company,* No. ISBN: 0–442–211396–4, 4 pgs [1693–1696].

Sherman, J.D. and Walters, M. (1996) "Synchronous Rectification: Improving the Efficiency of Buck Converter," *EDN.com,* Mar. 14, 1996, archives at http://www.edn.com/archives/1996/031496/06df4.htm, No. EDN –03.14.96, 5 pgs [1697–1701].

Soman, Vijay (1998) "Thermal Design Considerations–EL75XX," Intersil, Application Note, Mar. 20, 1998, No. AN1096, 6 pgs [834–839].

Sprock, Doug and Hsu, Ping (1997) "Predictive Discrete Time Control of Switch–mode Applications," Dept. of Elec. Eng., 1997 IEEE, pp. 175–181, No. 0–7803–3840–5/97, 7 pgs [1702–1708].

Stratakos et al., "DC Power Supply Design in Portable Systems," Electronics Research Laboratory, Memorandum No. MCB/ERL M95/4, Jan. 19, 1995 (Revised Apr. 26, 1995), pp. 1–62.

Stratakos et al., (1994) "A Low–Voltage CMOC DC–DC Converter for a Portable Battery–Operated System," 1994 IEEE, No. 0–7803–1859–5/94, 619–626, 8 pgs [1722–1729].

Stratakos, et al., Coauthored. Chapter 5, "DC Power Supply Design in Portable Systems," University of California, Berkeley, pp. 141–180, in Chandrakasan, Anantha P. and Brodersen, Robert W., Low Power Digital CMOS Design, Kluwer Academic Publishers, Norwell, MA, USA, 1995. ISBN 079239576X, 40 pages.

Takamura et al. (2000) "Low–thermal–resistance Flip–chip Fine Package For 1–W Voltage Regulator IC," *2000 IEEE/ CPMT,* Intn'l Electronics Manufacturing Technology Symposium, No. 0–7803–6482–1/00, pp. 305–310. 6 pgs.

Taketani et al. (1996) "CSP with LOC Technology," Hitachi Cable Ltd, Hitachi–shi Ibaraki–ken, Japan. Proc. Proceedings of SPIE —International Society for Optical Engineering; 2920, Proceeding of the 1996 International Symposium on Microelectronics. Oct. 1996. 6 pgs.

Texas Instruments, Inc. (1999) "Low–Dropout Voltage Regulators with Integrated Delayed Reset Function," TPS7301Q, TPS7325Q, TPS7330Q, TPS7333Q, TPS7348Q, TPS7350Q, SLVS124F–6/95, Production Data (brochure), Jan. 1999, 46 pgs [1315–1360].

Tsui et al. (2000) "Advanced Packaging Technologies in MOSFETs For Power Management," *2000 IEEE,* Electronic Components and Technology Conference, No. 0–7803–5911–9/00, 4 pgs.

Wan, Marlene et al. (1998) "An Energy Conscious Methodology for Early Design Exploration of Heterogeneous DSPs," IEEE Custom Integrated Circuits Conference, Sec. 7.1.1, 8 pgs [1613–1620].

Williams, Jim and Huffman, Brian (1998) "Switched–capacitor networks simplify dc–dc converter designs (technical)," *EDN,* retrieved from the Internet at http://www.highbeam.com/DocPrint.aspc/DocID=1G1:7220705, downloaded Nov. 18, 2008, 3 pgs [4833–4835].

Williams, Richard and Blattner, Robert (1993) "Benefits of DMOS Voltage Scaling on Synchronous Buck regulator Efficiency," 1993 IEEE, No. 0–7803–1313–5/93/0000–146, 146–151, 6 pgs [4827–4832].

Wong, Mike (1998) Designing a high Efficiency DC–DC Converter with the EL75XX, Intersil, Application Note, Mar. 24, 1998, No. AN1101, 16 pgs [840–855].

Zhou, Xunwei (1999), "Low–voltage High–efficiency Fast–transient Voltage Regulator Module," Dissertation submitted to Virginia Polytechnic Institute and State University, Jul. 1999, pp. i–xiv and 1–211 (226 pgs).

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3-6, 8, 10, 11 and 13-20 are cancelled.

New claims 41-88 are added and determined to be patentable.

Claims 2, 7, 9, 12 and 21-40 were not reexamined.

41. *An integrated circuit structure comprising: a first layer having a first conductive area and a second conductive area electrically isolated from the first conductive area, the first conductive area having an extended region at an edge of the first conductive area, the extended region of the first conductive area protruding into the second conductive area; and a second layer over the first layer, the second layer having a third conductive area and a fourth conductive area electrically isolated from the third conductive area, the fourth conductive area having an extended region at an edge of the fourth conductive area that is electrically coupled to the extended region of the first conductive area, the integrated circuit structure further comprising a substrate including a plurality of doped regions underlying the first and second layers, wherein a portion of the fourth conductive area other than the extended region is over the doped regions, the integrated circuit structure further comprising a third layer over the doped regions and underlying the first layer, the third layer comprising conductive stripes electrically coupled to the doped regions, alternating ones of the conductive stripes being electrically coupled to the third conductive area and the fourth conductive area, respectively.*

42. *The integrated circuit structure of claim 41 wherein the fourth conductive area overlaps the first conductive area only in the extended region of the fourth conductive area and the extended region of the first conductive area.*

43. *The integrated circuit structure of claim 41 wherein first ones of the conductive stripes are electrically coupled to the fourth conductive area by first vias between the third and first layers and second vias between the first and second layers.*

44. *The integrated circuit structure of claim 43 wherein the second vias are vertically aligned with corresponding ones of the first vias.*

45. *The integrated circuit structure of claim 43 wherein second ones of the conductive stripes are electrically coupled to the third conductive area by third vias between the third and first layers and fourth vias between the first and second layers.*

46. *The integrated circuit structure of claim 45 wherein the fourth vias are vertically aligned with corresponding ones of the third vias.*

47. *The integrated circuit structure of claim 41 further comprising a plurality of pads on the third and fourth conductive areas, the pads being above the doped regions.*

48. *The integrated circuit structure of claim 47 wherein first ones of the pads on the third conductive area comprise source pads, and second ones of the pads on the fourth conductive area comprises drain pads.*

49. *The integrated circuit structure of claim 47 wherein first ones of the pads on the third conductive area comprise drain pads, and second ones of the pads on the fourth conductive area comprises source pads.*

50. *The integrated circuit structure of claim 41 wherein current flows vertically between the fourth conductive area and first ones of the doped regions underlying the fourth conductive area, and between the fourth conductive area and second ones of the doped regions underlying the third conductive area through the extended region of the fourth conductive area.*

51. *The integrated circuit structure of claim 41 wherein the fourth conductive area has a pad for providing an external conductive coupling.*

52. *The integrated circuit structure of claim 41 wherein the integrated circuit structure further comprises a substrate under the first layer, the substrate having a first plurality of doped regions, and the fourth conductive area and the first conductive area being electrically coupled to the first plurality of doped regions.*

53. *The integrated circuit structure of claim 52 wherein the integrated circuit structure has a plurality of transistors and the first plurality of doped regions are source regions of the transistors.*

54. *The integrated circuit structure of claim 52 wherein the integrated circuit structure has a plurality of transistors and the first plurality of doped regions are drain regions of the transistors.*

55. *The integrated circuit structure of claim 41 wherein the extended region of the fourth conductive area has at least one lateral protrusion, the extended region of the first conductive area having at least one lateral protrusion that is electrically coupled to the lateral protrusion of the fourth conductive area, the lateral protrusion of the fourth conductive area overlapping the lateral protrusion of the first conductive area.*

56. *The integrated circuit structure of claim 41 wherein the extended region of the fourth conductive area is electrically coupled to the extended region of the first conductive area through a vertical via.*

57. *The integrated circuit structure of claim 41 wherein the third conductive area has an extended region at an edge of the third conductive area that is electrically coupled to an extended region at an edge of the second conductive area.*

58. *The integrated circuit structure of claim 57 wherein the third conductive area has a pad for providing an external conductive coupling.*

59. *The integrated circuit structure of claim 57 wherein the extended region of the first conductive area neighbors the extended region of the second conductive area with an insulation layer in-between.*

60. The integrated circuit structure of claim 57 wherein the integrated circuit structure further comprises a substrate having a first plurality of doped regions and a second plurality of doped regions, and the third conductive area and the second conductive area are electrically coupled to the second plurality of doped regions.

61. The integrated circuit structure of claim 60 wherein the first plurality of doped regions and the second plurality of doped regions are arranged in an alternating pattern in the substrate.

62. The integrated circuit structure of claim 60 wherein the integrated circuit structure has a plurality of transistors and the second plurality of doped regions are source regions of the transistors.

63. The integrated circuit structure of claim 60 wherein the integrated circuit structure has a plurality of transistors and the second plurality of doped regions are drain regions of the transistors.

64. The integrated circuit structure of claim 57 wherein the extended region of the third conductive area has at least one lateral protrusion, the extended region of the second conductive area having at least one lateral protrusion that is electrically coupled to the lateral protrusion of the third conductive area, the lateral protrusion of the third conductive area overlapping the lateral protrusion of the second conductive area.

65. The integrated circuit structure of claim 57 wherein the extended region of the third conductive area is electrically coupled to the extended region of the second conductive area through a vertical via.

66. An integrated circuit structure comprising: a first layer having a first conductive area and a second conductive area electrically isolated from the first conductive area, the first conductive area having an extended region at an edge of the first conductive area, the extended region of the first conductive area protruding into the second conductive area; and a second layer over the first layer, the second layer having a third conductive area and a fourth conductive area electrically isolated from the third conductive area, the fourth conductive area having an extended region at an edge of the fourth conductive area that is electrically coupled to the extended region of the first conductive area, the integrated circuit structure further comprising a substrate including a plurality of doped regions underlying the first and second layers, wherein a portion of the fourth conductive area other than the extended region is over the doped regions, the integrated circuit structure further comprising a third layer over the doped regions and underlying the first layer, the third layer comprising conductive portions electrically coupled to the doped regions, wherein first ones of the conductive portions of the third layer are electrically coupled to the fourth conductive area by first vias between the third and first layers and second vias between the first and second layers, and wherein the second vias are vertically aligned with corresponding ones of the first vias.

67. The integrated circuit structure of claim 66 wherein the fourth conductive area overlaps the first conductive area only in the extended region of the fourth conductive area and the extended region of the first conductive area.

68. The integrated circuit structure of claim 66 wherein the extended region of the fourth conductive area is electrically coupled to the extended region of the first conductive area through a vertical via.

69. The integrated circuit structure of claim 66 wherein second ones of the conductive portions of the third layer are electrically coupled to the third conductive area by third vias between the third and first layers and fourth vias between the first and second layers, and wherein the fourth vias are vertically aligned with corresponding ones of the third vias.

70. The integrated circuit structure of claim 66 further comprising a plurality of pads on the third and fourth conductive areas, the pads being above the doped regions.

71. The integrated circuit structure of claim 70 wherein first ones of the pads on the third conductive area comprise source pads, and second ones of the pads on the fourth conductive area comprises drain pads.

72. The integrated circuit structure of claim 70 wherein first ones of the pads on the third conductive area comprise drain pads, and second ones of the pads on the fourth conductive area comprises source pads.

73. The integrated circuit structure of claim 66 wherein current flows vertically through the first and second vias between the fourth conductive area and first ones of the doped regions underlying the fourth conductive area, and between the fourth conductive area and second ones of the doped regions underlying the third conductive area through the extended region of the fourth conductive area.

74. An integrated circuit structure comprising: a first layer having a first conductive area and a second conductive area electrically isolated from the first conductive area, the first conductive area having an extended region at an edge of the first conductive area, the extended region of the first conductive area protruding into the second conductive area; and a second layer over the first layer, the second layer having a third conductive area and a fourth conductive area electrically isolated from the third conductive area, the fourth conductive area having an extended region at an edge of the fourth conductive area that is electrically coupled to the extended region of the first conductive area, the integrated circuit structure further comprising a substrate including a plurality of doped regions underlying the first and second layers, the integrated circuit structure further comprising a third layer over the doped regions and underlying the first layer, the third layer comprising conductive stripes electrically coupled to the doped regions, alternating one of the conductive stripes being electrically coupled to the third conductive area and the fourth conductive area, respectively, the integrated circuit structure further comprising a plurality of pads on the third and fourth conductive areas, the pads being above the doped regions.

75. The integrated circuit structure of claim 74 wherein the fourth conductive area overlaps the first conductive area only in the extended region of the fourth conductive area and the extended region of the first conductive area.

76. The integrated circuit structure of claim 74 wherein the extended region of the fourth conductive area is electrically coupled to the extended region of the first conductive area through a vertical via.

77. The integrated circuit structure of claim 74 wherein first ones of the pads on the third conductive area comprise source pads, and second ones of the pads on the fourth conductive area comprises drain pads.

78. The integrated circuit structure of claim 74 wherein first ones of the pads on the third conductive area comprise drain pads, and second ones of the pads on the fourth conductive area comprises source pads.

79. The integrated circuit structure of claim 74 wherein current flows vertically between the pads on the fourth conductive area and first ones of the doped regions underlying the fourth conductive area, and between the pads on the fourth conductive area and second ones of the doped regions underlying the third conductive area through the extended region of the fourth conductive area.

80. The integrated circuit structure of claim 74 wherein first ones of the conductive stripes are electrically coupled to the fourth conductive area by first vias between the third and first layers and second vias between the first and second layers.

81. The integrated circuit structure of claim 80 wherein the second vias are vertically aligned with corresponding ones of the first vias.

82. The integrated circuit structure of claim 80 wherein second ones of the conductive stripes are electrically coupled to the third conductive area by third vias between the third and first layers and fourth vias between the first and second layers.

83. The integrated circuit structure of claim 82 wherein the fourth vias are vertically aligned with corresponding ones of the third vias.

84. An integrated circuit structure comprising: a first layer having a first conductive area and a second conductive area electrically isolated from the first conductive area, the first conductive area having an extended region at an edge of the first conductive area, the extended region of the first conductive area protruding into the second conductive area; and a second layer over the first layer, the second layer having a third conductive area and a fourth conductive area electrically isolated from the third conductive area, the fourth conductive area having an extended region at an edge of the fourth conductive area that is electrically coupled to the extended region of the first conductive area, the integrated circuit structure further comprising a substrate including a plurality of doped regions underlying the first and second layers, the integrated circuit structure further comprising a third layer over the doped regions and underlying the first layer, the third layer comprising conductive portions electrically coupled to the doped regions, wherein first ones of the conductive portions of the third layer are electrically coupled to the fourth conductive area by first vias between the third and first layers and second vias between the first and second layers, and wherein the second vias are vertically aligned with corresponding ones of the first vias, the integrated circuit structure further comprising a plurality of pads on the third and fourth conductive areas, the pads being above the doped regions.

85. The integrated circuit structure of claim 84 wherein first ones of the pads on the third conductive area comprise source pads, and second ones of the pads on the fourth conductive area comprises drain pads.

86. The integrated circuit structure of claim 84 wherein first ones of the pads on the third conductive area comprise drain pads, and second ones of the pads on the fourth conductive area comprises source pads.

87. The integrated circuit structure of claim 84 wherein second ones of the conductive portions of the third layer are electrically coupled to the third conductive area by third vias between the third and first layers and fourth vias between the first and second layers, and wherein the fourth vias are vertically aligned with corresponding ones of the third vias.

88. The integrated circuit structure of claim 84 wherein current flows vertically through the first and second vias between the fourth conductive area and first ones of the doped regions underlying the fourth conductive area, and between the fourth conductive area and second ones of the doped regions underlying the third conductive area through the extended region of the fourth conductive area.

* * * * *